United States Patent
Kato et al.

(10) Patent No.: US 9,460,376 B2
(45) Date of Patent: Oct. 4, 2016

(54) RADIO IC DEVICE

(75) Inventors: Noboru Kato, Moriyama (JP); Satoshi Ishino, Kusatsu (JP); Takeshi Kataya, Ritto (JP); Ikuhei Kimura, Nara (JP); Nobuo Ikemoto, Moriyama (JP); Yuya Dokai, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 94 days.

(21) Appl. No.: 12/688,072

(22) Filed: Jan. 15, 2010

(65) Prior Publication Data
US 2010/0103058 A1   Apr. 29, 2010

Related U.S. Application Data

(63) Continuation of application No. PCT/JP2008/063025, filed on Jul. 18, 2008.

(30) Foreign Application Priority Data

Jul. 18, 2007  (JP) .................. 2007-186391
Feb. 26, 2008  (JP) .................. 2008-044338

(51) Int. Cl.
*H01Q 1/22*   (2006.01)
*H01Q 1/24*   (2006.01)
(Continued)

(52) U.S. Cl.
CPC ... *G06K 19/06187* (2013.01); *G06K 19/07749* (2013.01); *G06K 19/07756* (2013.01);
(Continued)

(58) Field of Classification Search
CPC ........ H01Q 1/24; H01Q 1/241; H01Q 1/242; H01Q 1/243; H01Q 1/22; H01Q 1/2208; H01Q 13/00; H01Q 13/10; H01Q 13/106; H01Q 1/44

USPC .......................................... 343/702
See application file for complete search history.

(56) References Cited

U.S. PATENT DOCUMENTS 3,364,564 A   1/1968  Kurtz et al.
4,737,789 A * 4/1988  Nysen .................. 342/51
(Continued)

FOREIGN PATENT DOCUMENTS

CA    2 279 176 A1    7/1998
DE    10 2006 057 369 A1   6/2008
(Continued)

OTHER PUBLICATIONS

Official Communication issued in corresponding European Patent Application No. 08791334.9, mailed on Jul. 25, 2011.
(Continued)

*Primary Examiner* — Dameon E Levi
*Assistant Examiner* — Jennifer F Hu
(74) *Attorney, Agent, or Firm* — Keating & Bennett, LLP

(57) ABSTRACT

A radio IC device includes an electromagnetic coupling module includes a radio IC chip arranged to process transmitted and received signals and a feed circuit board including an inductance element. The feed circuit board includes an external electrode electromagnetically coupled to the feed circuit, and the external electrode is electrically connected to a shielding case or a wiring cable. The shielding case or the wiring cable functions as a radiation plate. The radio IC chip is operated by a signal received by the shielding case or the wiring, and the answer signal from the radio IC chip is radiated from the shielding case or the wiring cable to the outside. A metal component functions as the radiation plate, and the metal component may be a ground electrode disposed on the printed wiring board.

18 Claims, 29 Drawing Sheets

(51) Int. Cl.
*G06K 19/06* (2006.01)
*G06K 19/077* (2006.01)
*H01Q 1/36* (2006.01)
*H01Q 1/38* (2006.01)
*H01Q 1/42* (2006.01)
*H01Q 1/44* (2006.01)
*H01Q 7/00* (2006.01)
*H01Q 9/16* (2006.01)
*H01Q 9/30* (2006.01)
*H01Q 13/10* (2006.01)
*H05K 1/14* (2006.01)
*H05K 1/02* (2006.01)
*H05K 1/16* (2006.01)

(52) U.S. Cl.
CPC ... *G06K19/07779* (2013.01); *G06K 19/07783* (2013.01); *G06K 19/07784* (2013.01); *G06K 19/07786* (2013.01); *H01Q 1/36* (2013.01); *H01Q 1/38* (2013.01); *H01Q 1/42* (2013.01); *H01Q 1/44* (2013.01); *H01Q 7/00* (2013.01); *H01Q 9/16* (2013.01); *H01Q 9/30* (2013.01); *H01Q 13/10* (2013.01); *H05K 1/141* (2013.01); *H01L 2224/48091* (2013.01); *H01L 2224/48227* (2013.01); *H01L 2924/3011* (2013.01); *H01L 2924/3025* (2013.01); *H01L 2924/30107* (2013.01); *H05K 1/0237* (2013.01); *H05K 1/0239* (2013.01); *H05K 1/16* (2013.01); *H05K 2201/10371* (2013.01)

(56) References Cited

U.S. PATENT DOCUMENTS

| | | |
|---|---|---|
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,444,452 A * | 8/1995 | Itoh ......... H01Q 5/42 343/700 MS |
| 5,491,483 A | 2/1996 | D'Hont |
| 5,528,222 A | 6/1996 | Moskowitz et al. |
| 5,757,074 A | 5/1998 | Matloubian et al. |
| 5,854,480 A | 12/1998 | Noto |
| 5,903,239 A * | 5/1999 | Takahashi ......... H01Q 1/22 333/247 |
| 5,936,150 A | 8/1999 | Kobrin et al. |
| 5,955,723 A | 9/1999 | Reiner |
| 5,995,006 A | 11/1999 | Walsh |
| 6,040,804 A | 3/2000 | Harano |
| 6,104,611 A | 8/2000 | Lastinger |
| 6,107,920 A | 8/2000 | Eberhardt et al. |
| 6,172,608 B1 | 1/2001 | Cole |
| 6,181,287 B1 | 1/2001 | Beigel |
| 6,190,942 B1 | 2/2001 | Wilm et al. |
| 6,243,045 B1 | 6/2001 | Ishibashi |
| 6,249,258 B1 | 6/2001 | Bloch et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,424,300 B1 * | 7/2002 | Sanford et al. ......... 343/702 |
| 6,448,874 B1 | 9/2002 | Shiino et al. |
| 6,452,563 B1 | 9/2002 | Porte |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 * | 10/2003 | Kuramochi ......... G06K 7/10178 235/441 |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,861,731 B2 * | 3/2005 | Buijsman ......... H01L 23/552 257/659 |
| 6,927,738 B2 | 8/2005 | Senba et al. |
| 6,956,481 B1 | 10/2005 | Cole |
| 6,963,729 B2 | 11/2005 | Uozumi |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 2001/0021643 A1 | 9/2001 | Itoh |
| 2002/0011967 A1 | 1/2002 | Goff et al. |
| 2002/0015002 A1 | 2/2002 | Yasukawa et al. |
| 2002/0033772 A1 * | 3/2002 | Johnson ......... H01Q 1/243 343/702 |
| 2002/0044092 A1 | 4/2002 | Kushihi |
| 2002/0067316 A1 | 6/2002 | Yokoshima et al. |
| 2002/0093457 A1 | 7/2002 | Hamada et al. |
| 2002/0130402 A1 * | 9/2002 | Usami ......... G06K 19/07786 257/678 |
| 2002/0169010 A1 | 11/2002 | Shoji et al. |
| 2003/0006901 A1 | 1/2003 | Kim et al. |
| 2003/0020661 A1 | 1/2003 | Sato |
| 2003/0045324 A1 | 3/2003 | Nagumo et al. |
| 2003/0169153 A1 | 9/2003 | Muller |
| 2004/0001027 A1 | 1/2004 | Killen et al. |
| 2004/0026519 A1 | 2/2004 | Usami et al. |
| 2004/0056823 A1 | 3/2004 | Zuk et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2004/0252064 A1 * | 12/2004 | Yuanzhu ......... H01Q 1/243 343/702 |
| 2005/0090284 A1 | 4/2005 | Yuanzhu |
| 2005/0092836 A1 | 5/2005 | Kudo |
| 2005/0099337 A1 | 5/2005 | Takei et al. |
| 2005/0122268 A1 | 6/2005 | Suzuki |
| 2005/0125093 A1 | 6/2005 | Kikuchi et al. |
| 2005/0134460 A1 | 6/2005 | Usami |
| 2005/0134506 A1 | 6/2005 | Egbert |
| 2005/0138798 A1 | 6/2005 | Sakama et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0275539 A1 | 12/2005 | Sakama et al. |
| 2006/0001138 A1 | 1/2006 | Sakama et al. |
| 2006/0032926 A1 | 2/2006 | Baba et al. |
| 2006/0043198 A1 * | 3/2006 | Forster ......... 235/492 |
| 2006/0044192 A1 | 3/2006 | Egbert |
| 2006/0049995 A1 * | 3/2006 | Imaoka ......... H01Q 1/22 343/702 |
| 2006/0055531 A1 | 3/2006 | Cook et al. |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0214801 A1 | 9/2006 | Murofushi et al. |
| 2006/0220871 A1 | 10/2006 | Baba et al. |
| 2006/0244568 A1 | 11/2006 | Tong et al. |
| 2006/0244676 A1 | 11/2006 | Uesaka |
| 2006/0267138 A1 | 11/2006 | Kobayashi |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0052596 A1 * | 3/2007 | Liu ......... H01Q 1/243 343/702 |

(56) References Cited

U.S. PATENT DOCUMENTS

| | | | |
|---|---|---|---|
| 2007/0052613 A1* | 3/2007 | Gallschuetz | G06K 19/07749 343/860 |
| 2007/0057854 A1 | 3/2007 | Oodachi et al. | |
| 2007/0069037 A1 | 3/2007 | Kawai | |
| 2007/0132591 A1 | 6/2007 | Khatri | |
| 2007/0164414 A1 | 7/2007 | Dokai et al. | |
| 2007/0200782 A1 | 8/2007 | Hayama et al. | |
| 2007/0229276 A1 | 10/2007 | Yamagajo et al. | |
| 2007/0247387 A1 | 10/2007 | Kubo et al. | |
| 2007/0252700 A1 | 11/2007 | Ishihara et al. | |
| 2007/0252703 A1 | 11/2007 | Kato et al. | |
| 2007/0285335 A1 | 12/2007 | Bungo et al. | |
| 2007/0290928 A1 | 12/2007 | Chang et al. | |
| 2008/0024156 A1 | 1/2008 | Arai et al. | |
| 2008/0068132 A1 | 3/2008 | Kayanakis et al. | |
| 2008/0070003 A1 | 3/2008 | Nakatani et al. | |
| 2008/0087990 A1 | 4/2008 | Kato et al. | |
| 2008/0143630 A1 | 6/2008 | Kato et al. | |
| 2008/0169905 A1 | 7/2008 | Slatter | |
| 2008/0184281 A1 | 7/2008 | Ashizaki et al. | |
| 2008/0272885 A1 | 11/2008 | Atherton | |
| 2009/0002130 A1 | 1/2009 | Kato | |
| 2009/0009007 A1 | 1/2009 | Kato et al. | |
| 2009/0021352 A1 | 1/2009 | Kataya et al. | |
| 2009/0021446 A1 | 1/2009 | Kataya et al. | |
| 2009/0065594 A1 | 3/2009 | Kato et al. | |
| 2009/0109102 A1 | 4/2009 | Dokai et al. | |
| 2009/0160719 A1 | 6/2009 | Kato et al. | |
| 2009/0201116 A1 | 8/2009 | Orihara | |
| 2009/0224061 A1 | 9/2009 | Kato et al. | |
| 2009/0231106 A1 | 9/2009 | Okamura | |
| 2009/0262041 A1 | 10/2009 | Ikemoto et al. | |
| 2009/0266900 A1 | 10/2009 | Ikemoto et al. | |
| 2009/0278687 A1 | 11/2009 | Kato | |
| 2009/0321527 A1 | 12/2009 | Kato et al. | |
| 2010/0103058 A1 | 4/2010 | Kato et al. | |
| 2010/0182210 A1 | 7/2010 | Ryou et al. | |
| 2010/0308118 A1 | 12/2010 | Kataya et al. | |
| 2011/0031320 A1 | 2/2011 | Kato et al. | |
| 2011/0063184 A1 | 3/2011 | Furumura et al. | |

FOREIGN PATENT DOCUMENTS

| | | |
|---|---|---|
| EP | 0 694 874 A2 | 1/1996 |
| EP | 0 848 448 A2 | 6/1998 |
| EP | 0 948 083 A2 | 10/1999 |
| EP | 0 977 145 A2 | 2/2000 |
| EP | 1 010 543 A1 | 6/2000 |
| EP | 1 085 480 A1 | 3/2001 |
| EP | 1 160 915 A2 | 12/2001 |
| EP | 1 170 795 A2 | 1/2002 |
| EP | 1 193 793 A2 | 4/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 547 753 A1 | 6/2005 |
| EP | 1 548 872 A1 | 6/2005 |
| EP | 1 626 364 A2 | 2/2006 |
| EP | 1 701 296 A1 | 9/2006 |
| EP | 1 703 589 A1 | 9/2006 |
| EP | 1 742 296 A1 | 1/2007 |
| EP | 1 744 398 A1 | 1/2007 |
| EP | 1 840 802 A1 | 10/2007 |
| EP | 1 841 005 A1 | 10/2007 |
| EP | 1 865 574 A1 | 12/2007 |
| EP | 1 887 652 A1 | 2/2008 |
| EP | 1 976 056 A1 | 10/2008 |
| EP | 1 988 491 A1 | 11/2008 |
| EP | 1 988 601 A1 | 11/2008 |
| EP | 1 993 170 A1 | 11/2008 |
| EP | 2 009 738 A1 | 12/2008 |
| EP | 2 012 258 A1 | 1/2009 |
| EP | 2 096 709 A1 | 9/2009 |
| EP | 2 148 449 A1 | 1/2010 |
| EP | 2 166 617 A1 | 3/2010 |
| EP | 2 251 934 A1 | 11/2010 |
| EP | 2 256 861 A1 | 12/2010 |
| EP | 2 264 831 A1 | 12/2010 |
| EP | 2 330 684 A1 | 6/2011 |
| GB | 2 305 075 A | 3/1997 |
| GB | 2461443 A | 1/2010 |
| JP | 50-143451 A | 11/1975 |
| JP | 61-123303 A | 6/1986 |
| JP | 61-284102 A | 12/1986 |
| JP | 62-127140 U | 8/1987 |
| JP | 01-212035 A | 8/1989 |
| JP | 02-164105 A | 6/1990 |
| JP | 02-256208 A | 10/1990 |
| JP | 3-171385 A | 7/1991 |
| JP | 03-503467 A | 8/1991 |
| JP | 03-262313 A | 11/1991 |
| JP | 04-150011 A | 5/1992 |
| JP | 04-167500 A | 6/1992 |
| JP | 04-096814 U | 8/1992 |
| JP | 04-101168 U | 9/1992 |
| JP | 04-134807 U | 12/1992 |
| JP | 05-226926 A | 9/1993 |
| JP | 5-91013 U | 12/1993 |
| JP | 05-327331 A | 12/1993 |
| JP | 6-53733 A | 2/1994 |
| JP | 06-077729 A | 3/1994 |
| JP | 06-177635 A | 6/1994 |
| JP | 6-260949 A | 9/1994 |
| JP | 07-183836 A | 7/1995 |
| JP | 7-221529 A | 8/1995 |
| JP | 7-321688 A | 12/1995 |
| JP | 08-055725 A | 2/1996 |
| JP | 08-056113 A | 2/1996 |
| JP | 8-87580 A | 4/1996 |
| JP | 08-088586 A | 4/1996 |
| JP | 08-88586 A | 4/1996 |
| JP | 08-176421 A | 7/1996 |
| JP | 08-180160 A | 7/1996 |
| JP | 8-204438 A | 8/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-035025 A | 2/1997 |
| JP | 9-93029 A | 4/1997 |
| JP | 09-093029 A | 4/1997 |
| JP | 9-232854 A | 9/1997 |
| JP | 09-245381 A | 9/1997 |
| JP | 09-252217 A | 9/1997 |
| JP | 09-270623 A | 10/1997 |
| JP | 09-284038 A | 10/1997 |
| JP | 9-512367 A | 12/1997 |
| JP | 10-069533 A | 3/1998 |
| JP | 10-69533 A | 3/1998 |
| JP | 10-145987 A | 5/1998 |
| JP | 10-505466 A | 5/1998 |
| JP | 10-171954 A | 6/1998 |
| JP | 10-173427 A | 6/1998 |
| JP | 10-193849 A | 7/1998 |
| JP | 10-193851 A | 7/1998 |
| JP | 10-293828 A | 11/1998 |
| JP | 10-334203 A | 12/1998 |
| JP | 11-025244 A | 1/1999 |
| JP | 11-039441 A | 2/1999 |
| JP | 11-075329 A | 3/1999 |
| JP | 11-085937 A | 3/1999 |
| JP | 11-88241 A | 3/1999 |
| JP | 11-102424 A | 4/1999 |
| JP | 11-103209 A | 4/1999 |
| JP | 11-112222 A | 4/1999 |
| JP | 11-149536 A | 6/1999 |
| JP | 11-149537 A | 6/1999 |
| JP | 11-149538 A | 6/1999 |
| JP | 11-175678 A | 7/1999 |
| JP | 11-219420 A | 8/1999 |
| JP | 11-220319 A | 8/1999 |
| JP | 11-282993 A | 10/1999 |

(56) References Cited

FOREIGN PATENT DOCUMENTS

| | | |
|---|---|---|
| JP | 11-328352 A | 11/1999 |
| JP | 11-331014 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2000-059260 A | 2/2000 |
| JP | 2000-085283 A | 3/2000 |
| JP | 2000-090207 A | 3/2000 |
| JP | 2000-132643 A | 5/2000 |
| JP | 2000-137778 A | 5/2000 |
| JP | 2000-137779 A | 5/2000 |
| JP | 2000-137785 A | 5/2000 |
| JP | 2000-148948 A | 5/2000 |
| JP | 2000-172812 A | 6/2000 |
| JP | 2000-209013 A | 7/2000 |
| JP | 2000-222540 A | 8/2000 |
| JP | 2000-510271 A | 8/2000 |
| JP | 2000-242754 A | 9/2000 |
| JP | 2000-243797 A | 9/2000 |
| JP | 2000-251049 A | 9/2000 |
| JP | 2000-261230 A | 9/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 2000-349680 A | 12/2000 |
| JP | 2001-10264 A | 1/2001 |
| JP | 2001-028036 A | 1/2001 |
| JP | 2001-34725 A | 2/2001 |
| JP | 2001-043340 A | 2/2001 |
| JP | 3075400 U | 2/2001 |
| JP | 2001-66990 A | 3/2001 |
| JP | 2001-76111 A | 3/2001 |
| JP | 2001-084463 A | 3/2001 |
| JP | 2001-101369 A | 4/2001 |
| JP | 2001-505682 A | 4/2001 |
| JP | 2001-168628 A | 6/2001 |
| JP | 2001-188890 A | 7/2001 |
| JP | 2001-240046 A | 9/2001 |
| JP | 2001-240217 A | 9/2001 |
| JP | 2001-251118 A | 9/2001 |
| JP | 2001-256457 A | 9/2001 |
| JP | 2001-257292 A | 9/2001 |
| JP | 2001-514777 A | 9/2001 |
| JP | 2001-274719 A | 10/2001 |
| JP | 2001-291181 A | 10/2001 |
| JP | 2001-319380 A | 11/2001 |
| JP | 2001-320137 A | 11/2001 |
| JP | 2001-331976 A | 11/2001 |
| JP | 2001-332923 A | 11/2001 |
| JP | 2001-339226 A | 12/2001 |
| JP | 2001-344574 A | 12/2001 |
| JP | 2001-351083 A | 12/2001 |
| JP | 2001-351084 A | 12/2001 |
| JP | 2001-352176 A | 12/2001 |
| JP | 2001-358527 A | 12/2001 |
| JP | 2002-024776 A | 1/2002 |
| JP | 2002-026513 A | 1/2002 |
| JP | 2002-32731 A | 1/2002 |
| JP | 2002-042076 A | 2/2002 |
| JP | 2002-063557 A | 2/2002 |
| JP | 2002-505645 A | 2/2002 |
| JP | 2002-76750 A | 3/2002 |
| JP | 2002-076750 A | 3/2002 |
| JP | 2002-111363 A | 4/2002 |
| JP | 2002-141726 A | 5/2002 |
| JP | 2002-150245 A | 5/2002 |
| JP | 2002-157564 A | 5/2002 |
| JP | 2002-158529 A | 5/2002 |
| JP | 2002-175508 A | 6/2002 |
| JP | 2002-183690 A | 6/2002 |
| JP | 2002-185358 A | 6/2002 |
| JP | 2002-204117 A | 7/2002 |
| JP | 2002-521757 A | 7/2002 |
| JP | 2002-522849 A | 7/2002 |
| JP | 2002-230128 A | 8/2002 |
| JP | 2002-232221 A | 8/2002 |
| JP | 2002-246828 A | 8/2002 |
| JP | 2002-252117 A | 9/2002 |
| JP | 2002-259934 A | 9/2002 |
| JP | 2002-280821 A | 9/2002 |
| JP | 2002-298109 A | 10/2002 |
| JP | 2002-308437 A | 10/2002 |
| JP | 2002-319008 A | 10/2002 |
| JP | 2002-319009 A | 10/2002 |
| JP | 2002-319812 A | 10/2002 |
| JP | 2002-335180 A | 11/2002 |
| JP | 2002-362613 A | 12/2002 |
| JP | 2002-366917 A | 12/2002 |
| JP | 2002-373029 A | 12/2002 |
| JP | 2002-373323 A | 12/2002 |
| JP | 2002-374139 A | 12/2002 |
| JP | 2003-006599 A | 1/2003 |
| JP | 2003-016412 A | 1/2003 |
| JP | 2003-022912 A | 1/2003 |
| JP | 2003-026177 A | 1/2003 |
| JP | 2003-030612 A | 1/2003 |
| JP | 2003-037861 A | 2/2003 |
| JP | 2003-44789 A | 2/2003 |
| JP | 2003-046318 A | 2/2003 |
| JP | 2003-58840 A | 2/2003 |
| JP | 2003-067711 A | 3/2003 |
| JP | 2003-069335 A | 3/2003 |
| JP | 2003-076947 A | 3/2003 |
| JP | 2003-76963 A | 3/2003 |
| JP | 2003-78333 A | 3/2003 |
| JP | 2003-078336 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099184 A | 4/2003 |
| JP | 2003-099720 A | 4/2003 |
| JP | 2003-099721 A | 4/2003 |
| JP | 2003-110344 A | 4/2003 |
| JP | 2003-132330 A | 5/2003 |
| JP | 2003-134007 A | 5/2003 |
| JP | 2003-155062 A | 5/2003 |
| JP | 2003-158414 A | 5/2003 |
| JP | 2003-168760 A | 6/2003 |
| JP | 2003-179426 A | 6/2003 |
| JP | 2003-179565 A | 6/2003 |
| JP | 2003-187207 A | 7/2003 |
| JP | 2003-187211 A | 7/2003 |
| JP | 2003-188338 A | 7/2003 |
| JP | 2003-188620 A | 7/2003 |
| JP | 2003-198230 A | 7/2003 |
| JP | 2003-209421 A | 7/2003 |
| JP | 2003-216919 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-249813 A | 9/2003 |
| JP | 2003-529163 A | 9/2003 |
| JP | 2003-288560 A | 10/2003 |
| JP | 2003-309418 A | 10/2003 |
| JP | 2003-317060 A | 11/2003 |
| JP | 2003-331246 A | 11/2003 |
| JP | 2003-332820 A | 11/2003 |
| JP | 2003-536302 A | 12/2003 |
| JP | 2004-040597 A | 2/2004 |
| JP | 2004-505481 A | 2/2004 |
| JP | 2004-082775 A | 3/2004 |
| JP | 2004-88218 A | 3/2004 |
| JP | 2004-93693 A | 3/2004 |
| JP | 2004-096566 A | 3/2004 |
| JP | 2004-096618 A | 3/2004 |
| JP | 2004-126750 A | 4/2004 |
| JP | 2004-127230 A | 4/2004 |
| JP | 2004-140513 A | 5/2004 |

(56) References Cited

FOREIGN PATENT DOCUMENTS

| | | |
|---|---|---|
| JP | 2004-163134 A | 6/2004 |
| JP | 2004-172919 A | 6/2004 |
| JP | 2004-213582 A | 7/2004 |
| JP | 2004-519916 A | 7/2004 |
| JP | 2004-234595 A | 8/2004 |
| JP | 2004-253858 A | 9/2004 |
| JP | 2004-527864 A | 9/2004 |
| JP | 2004-280390 A | 10/2004 |
| JP | 2004-282403 A | 10/2004 |
| JP | 2004-287767 A | 10/2004 |
| JP | 2004-295297 A | 10/2004 |
| JP | 2004-297249 A | 10/2004 |
| JP | 2004-297681 A | 10/2004 |
| JP | 2004-304370 A | 10/2004 |
| JP | 2004-319848 A | 11/2004 |
| JP | 2004-326380 A | 11/2004 |
| JP | 2004-334268 A | 11/2004 |
| JP | 2004-336250 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-5866 A | 1/2005 |
| JP | 2005-18156 A | 1/2005 |
| JP | 2005-033461 A | 2/2005 |
| JP | 2005-124061 A | 5/2005 |
| JP | 2005-128592 A | 5/2005 |
| JP | 2005-129019 A | 5/2005 |
| JP | 2005-130188 A | 5/2005 |
| JP | 2005-135132 A | 5/2005 |
| JP | 2005-136528 A | 5/2005 |
| JP | 2005-137032 A | 5/2005 |
| JP | 3653099 B2 | 5/2005 |
| JP | 2005-165839 A | 6/2005 |
| JP | 2005-167327 A | 6/2005 |
| JP | 2005-167813 A | 6/2005 |
| JP | 2005-167900 A | 6/2005 |
| JP | 2005-190417 A | 7/2005 |
| JP | 2005-191705 A | 7/2005 |
| JP | 2005-192124 A | 7/2005 |
| JP | 2005-210223 A | 8/2005 |
| JP | 2005-210676 A | 8/2005 |
| JP | 2005-210680 A | 8/2005 |
| JP | 2005-217822 A | 8/2005 |
| JP | 2005-229474 A | 8/2005 |
| JP | 2005-236339 A | 9/2005 |
| JP | 2005-244778 A | 9/2005 |
| JP | 2005-252853 A | 9/2005 |
| JP | 2005-275870 A | 10/2005 |
| JP | 2005-284352 A | 10/2005 |
| JP | 2005-284455 A | 10/2005 |
| JP | 2005-293537 A | 10/2005 |
| JP | 2005-295135 A | 10/2005 |
| JP | 2005-311205 A | 11/2005 |
| JP | 2005-321305 A | 11/2005 |
| JP | 2005-322119 A | 11/2005 |
| JP | 2005-335755 A | 12/2005 |
| JP | 2005-340759 A | 12/2005 |
| JP | 2005-345802 A | 12/2005 |
| JP | 2005-346820 A | 12/2005 |
| JP | 2005-352858 A | 12/2005 |
| JP | 2006-013976 A | 1/2006 |
| JP | 2006-13976 A | 1/2006 |
| JP | 2006-025390 A | 1/2006 |
| JP | 2006-031766 A | 2/2006 |
| JP | 2006-033312 A | 2/2006 |
| JP | 2006-39902 A | 2/2006 |
| JP | 2006-039947 A | 2/2006 |
| JP | 2006-42059 A | 2/2006 |
| JP | 2006-42097 A | 2/2006 |
| JP | 2006-050200 A | 2/2006 |
| JP | 2006-053833 A | 2/2006 |
| JP | 2006-67479 A | 3/2006 |
| JP | 2006-72706 A | 3/2006 |
| JP | 2006-074348 A | 3/2006 |
| JP | 2006-80367 A | 3/2006 |
| JP | 2006-92630 A | 4/2006 |
| JP | 2006-102953 A | 4/2006 |
| JP | 2006-107296 A | 4/2006 |
| JP | 2006-513594 A | 4/2006 |
| JP | 2006-148462 A | 6/2006 |
| JP | 2006-148518 A | 6/2006 |
| JP | 2006-151402 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-238282 A | 9/2006 |
| JP | 2006-242736 A | 9/2006 |
| JP | 2006-246372 A | 9/2006 |
| JP | 2006-270212 A | 10/2006 |
| JP | 2006-270681 A | 10/2006 |
| JP | 2006-270766 A | 10/2006 |
| JP | 2006-285911 A | 10/2006 |
| JP | 2006-287659 A | 10/2006 |
| JP | 2006-295879 A | 10/2006 |
| JP | 2006-302219 A | 11/2006 |
| JP | 2006-309401 A | 11/2006 |
| JP | 2006-311239 A | 11/2006 |
| JP | 2006-323481 A | 11/2006 |
| JP | 2006-339964 A | 12/2006 |
| JP | 2007-6123 A | 1/2007 |
| JP | 2007-007888 A | 1/2007 |
| JP | 2007-13120 A | 1/2007 |
| JP | 2007-18067 A | 1/2007 |
| JP | 2007-019905 A | 1/2007 |
| JP | 2007-28002 A | 2/2007 |
| JP | 2007-040702 A | 2/2007 |
| JP | 2007-043535 A | 2/2007 |
| JP | 2007-048126 A | 2/2007 |
| JP | 2007-65822 A | 3/2007 |
| JP | 2007-79687 A | 3/2007 |
| JP | 2007-81712 A | 3/2007 |
| JP | 2007-096768 A | 4/2007 |
| JP | 2007-102348 A | 4/2007 |
| JP | 2007-116347 A | 5/2007 |
| JP | 2007-122542 A | 5/2007 |
| JP | 2007-150642 A | 6/2007 |
| JP | 2007-150868 A | 6/2007 |
| JP | 2007-159083 A | 6/2007 |
| JP | 2007-159129 A | 6/2007 |
| JP | 2007-166133 A | 6/2007 |
| JP | 2007-172369 A | 7/2007 |
| JP | 2007-172527 A | 7/2007 |
| JP | 2007-228254 A | 9/2007 |
| JP | 2007-228325 A | 9/2007 |
| JP | 2007-233597 A | 9/2007 |
| JP | 2007-266999 A | 10/2007 |
| JP | 2007-272264 A | 10/2007 |
| JP | 2007-287128 A | 11/2007 |
| JP | 2007-295557 A | 11/2007 |
| JP | 2007-312350 A | 11/2007 |
| JP | 2007-324865 A | 12/2007 |
| JP | 2008-033716 A | 2/2008 |
| JP | 2008-042910 A | 2/2008 |
| JP | 2008-72243 A | 3/2008 |
| JP | 2008-083867 A | 4/2008 |
| JP | 2008-097426 A | 4/2008 |
| JP | 2008-098993 A | 4/2008 |
| JP | 4069958 B2 | 4/2008 |
| JP | 2008-103691 A | 5/2008 |
| JP | 2008-107947 A | 5/2008 |
| JP | 2008-513888 A | 5/2008 |
| JP | 2008-148345 A | 6/2008 |
| JP | 2008-519347 A | 6/2008 |
| JP | 2008-160874 A | 7/2008 |
| JP | 2008-167190 A | 7/2008 |
| JP | 2008-197714 A | 8/2008 |
| JP | 2008-535372 A | 8/2008 |
| JP | 2008-207875 A | 9/2008 |
| JP | 2008-217406 A | 9/2008 |

(56) References Cited

FOREIGN PATENT DOCUMENTS

| | | |
|---|---|---|
| JP | 2008-288915 A | 11/2008 |
| JP | 2009-017284 A | 1/2009 |
| JP | 2009-25870 A | 2/2009 |
| JP | 2009-27291 A | 2/2009 |
| JP | 2009-044647 A | 2/2009 |
| JP | 2009-044715 A | 2/2009 |
| JP | 3148168 U | 2/2009 |
| JP | 2009-110144 A | 5/2009 |
| JP | 2009-153166 A | 7/2009 |
| JP | 2009-182630 A | 8/2009 |
| JP | 2010-009196 A | 1/2010 |
| JP | 2010-081571 | 4/2010 |
| JP | 4609604 B2 | 1/2011 |
| NL | 9100176 A | 3/1992 |
| NL | 9100347 A | 3/1992 |
| WO | 98/33142 A1 | 7/1998 |
| WO | 99/67754 A1 | 12/1999 |
| WO | 00/10122 A2 | 2/2000 |
| WO | 01/95242 A2 | 12/2001 |
| WO | 02/48980 A1 | 6/2002 |
| WO | 02/061675 A1 | 8/2002 |
| WO | 02/097723 A1 | 12/2002 |
| WO | 03/079305 A1 | 9/2003 |
| WO | 2004/025554 A1 | 3/2004 |
| WO | 2004/036772 A2 | 4/2004 |
| WO | 2004/070879 A | 8/2004 |
| WO | 2004/072892 A2 | 8/2004 |
| WO | 2005/073937 A | 8/2005 |
| WO | 2005/091434 A1 | 9/2005 |
| WO | 2005/115849 A1 | 12/2005 |
| WO | 2006/045682 A | 5/2006 |
| WO | 2006/048663 A1 | 5/2006 |
| WO | 2006/114821 A1 | 11/2006 |
| WO | 2007/083574 A1 | 7/2007 |
| WO | 2007/083575 A1 | 7/2007 |
| WO | 2007/086130 A1 | 8/2007 |
| WO | 2007/094494 A1 | 8/2007 |
| WO | 2007/097385 A1 | 8/2007 |
| WO | 2007/102360 A1 | 9/2007 |
| WO | 2007/105348 A1 | 9/2007 |
| WO | 2007/119310 A1 | 10/2007 |
| WO | 2007/125683 A1 | 11/2007 |
| WO | 2007/132094 A1 | 11/2007 |
| WO | 2007/138857 A1 | 12/2007 |
| WO | 2008/007606 A | 1/2008 |
| WO | 2008/081699 A1 | 7/2008 |
| WO | 2008/126458 A1 | 10/2008 |
| WO | 2008/133018 A1 | 11/2008 |
| WO | 2008/140037 A1 | 11/2008 |
| WO | 2008/142957 A1 | 11/2008 |
| WO | 2009/008296 A1 | 1/2009 |
| WO | 2009/011144 A1 | 1/2009 |
| WO | 2009/011376 A1 | 1/2009 |
| WO | 2009/011400 A1 | 1/2009 |
| WO | 2009/011423 A1 | 1/2009 |
| WO | 2009/081719 A1 | 7/2009 |
| WO | 2009/110381 A1 | 9/2009 |
| WO | 2009/119548 A1 | 10/2009 |
| WO | 2009/128437 A1 | 10/2009 |
| WO | 2010/026939 A1 | 3/2010 |

OTHER PUBLICATIONS

Official Communication issued in International Patent Application No. PCT/JP2010/066291, mailed on Dec. 28, 2010.
Ikemoto: "Communication Terminal and Information Processing System"; U.S. Appl. No. 13/432,002, filed Mar. 28, 2012.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags")", RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato et al.: "Wireless IC Device"; U.S. Appl. No. 12/429,346, filed Apr. 24, 2009.
Official Communication issued in International Patent Application No. PCT/JP2009/066336, mailed on Dec. 22, 2009.
Official Communication issued in corresponding Japanese Patent Application No. 2010-509439, mailed on Jul. 6, 2010.
Official Communication issued in corresponding Japanese Patent Application No. 2011-032311, mailed on Mar. 29, 2011.
Official Communication issued in corresponding Japanese Patent Application No. 2009-525327, drafted on Sep. 22, 2010.
Official Communication issued in corresponding Japanese Patent Application No. 2011-032311, mailed on Aug. 2, 2011.
Official Communication issued in corresponding Japanese Patent Application No. 2011-032312, mailed on Aug. 2, 2011.
Official Communication issued in corresponding Japanese Patent Application No. 2011-032311, mailed on Aug. 23, 2011.
Kato et al.: "Wireless IC Device Component and Wireless IC Device"; U.S. Appl. No. 13/241,823, filed Sep. 23, 2011.
Kato et al.: "Antenna Device and Method of Setting Resonant Frequency of Antenna Device"; U.S. Appl. No. 13/272,365, filed Oct. 13, 2011.
Official communication issued in International Patent Application No. PCT/JP2010/056812, mailed on Jul. 13, 2010.
Dokai et al.: "Optical Disc"; U.S. Appl. No. 13/295,153, filed Nov. 14, 2011.
Official Communication issued in International Patent Application No. PCT/JP2010/057668, mailed on Aug. 17, 2010.
Osamura et al.: "Radio Frequency IC Device and Method of Manufacturing the Same"; U.S. Appl. No. 13/308,575, filed Dec. 1, 2011.
Official Communication issued in International Patent Application No. PCT/JP2010/069417, mailed on Dec. 7, 2010.
Kato: "Wireless IC Device and Coupling Method for Power Feeding Circuit and Radiation Plate"; U.S. Appl. No. 13/325,273, filed Dec. 14, 2011.

(56) References Cited

OTHER PUBLICATIONS

Official Communication issued in International Patent Application No. PCT/JP2010/053496, mailed on Jun. 1, 2010.
Ikemoto: "Wireless IC Tag, Reader-Writer, and Information Processing System"; U.S. Appl. No. 13/329,354, filed Dec. 19, 2011.
Kato et al.: "Antenna and Antenna Module"; U.S. Appl. No. 13/334,462, filed Dec. 22, 2011.
Official Communication issued in International Patent Application No. PCT/JP2010/069418, mailed on Feb. 8, 2011.
Official Communication issued in International Patent Application No. PCT/JP2010/063082, mailed on Nov. 16, 2010.
Ikemoto: "Communication Terminal and Information Processing System"; U.S. Appl. No. 13/412,772, filed Mar. 6, 2012.
"Antenna Engineering Handbook", The Institute of Electronics and Communication Engineers, Mar. 5, 1999, pp. 20-21.
Official Communication issued in International Patent Application No. PCT/JP2010/066714, mailed on Dec. 14, 2010.
Nomura et al.: "Antenna and Wireless IC Device"; U.S. Appl. No. 13/419,454, filed Mar. 14, 2012.
Official Communication issued in International Patent Application No. PCT/JP2010/070607, mailed on Feb. 15, 2011.
Ito: "Wireless IC Device and Method of Detecting Environmental State Using the Device"; U.S. Appl. No. 13/421,889, filed Mar. 16, 2012.
Official Communication issued in International Patent Application No. PCT/JP2011/053654, mailed on Mar. 29, 2011.
Kato et al.: "Antenna Device and Mobile Communication Terminal"; U.S. Appl. No. 13/425,505, filed Mar. 21, 2012.
Official Communication issued in International Patent Application No. PCT/JP2010/069416, mailed on Feb. 8, 2011.
Kato et al.: "Wireless Communication Device and Metal Article"; U.S. Appl. No. 13/429,465, filed Mar. 26, 2012.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official communication issued in counterpart International Application No. PCT/JP2008/071502, mailed Feb. 24, 2009.
Kato et al.: "Wireless IC Device and Manufacturing Method Thereof,"; U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device,"; U.S. Appl. No. 12/469,896, filed May 21, 2009.
Ikemoto et al.: "Wireless IC Device,"; U.S. Appl. No. 12/496,709, filed Jul. 2, 2009.
Official communication issued in counterpart International Application No. PCT/JP2008/062947, mailed Aug. 19, 2008.
Official communication issued in counterpart International Application No. PCT/JP2008/056026, mailed Jul. 1, 2008.
Ikemoto et al.: "Wireless IC Device and Electronic Apparatus,"; U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device,"; U.S. Appl. No. 12/510,338, filed Jul. 28, 2009.
Kato et al.: "Wireless IC Device,"; U.S. Appl. No. 12/510,340, filed Jul. 28, 2009.
Kato: "Wireless IC Device,"; U.S. Appl. No. 12/510,344, filed Jul. 28, 2009.
Kato et al.: "Wireless IC Device,"; U.S. Appl. No. 12/510,347, filed Jul. 28, 2009.
Official Communication issued in International Patent Application No. PCT/JP2009/069486, mailed on Mar. 2, 2010.
Kato: "Radio IC Device"; U.S. Appl. No. 13/080,775, filed Apr. 6, 2011.
Kato et al.: "Antenna and Wireless IC Device"; U.S. Appl. No. 13/083,626, filed Apr. 11, 2011.
Official Communication issued in International Patent Application No. PCT/JP2009/070617, mailed on Mar. 16, 2010.
Nagai, "Mounting Technique of RFID by Roll-To-Roll Process", Material Stage, Technical Information Institute Co., LTD, vol. 7, No. 9, 2007, pp. 4-12.
Dokai et al.: "Wireless IC Device"; U.S. Appl. No. 13/088,480, filed Apr. 18, 2011.
Kato et al.: "High-Frequency Device and Wireless IC Device"; U.S. Appl. No. 13/094,928, filed Apr. 27, 2011.
Dokai et al.: "Wireless IC Device"; U.S. Appl. No. 13/099,392, filed May 3, 2011.
Kato et al.: "Radio Frequency IC Device"; U.S. Appl. No. 13/163,803, filed Jun. 20, 2011.
Official Communication issued in International Patent Application No. PCT/JP2010/050170, mailed on Apr. 13, 2010.
Official Communication issued in International Patent Application No. PCT/JP2010/051205, mailed on May 11, 2010.
Kato: "Wireless IC Device, Wireless IC Module and Method of Manufacturing Wireless IC Module"; U.S. Appl. No. 13/169,067, filed Jun. 27, 2011.
Kato et al.: "Antenna and Wireless IC Device"; U.S. Appl. No. 13/190,670, filed Jul. 26, 2011.
Shiroki et al.: "RFIC Chip Mounting Structure"; U.S. Appl. No. 13/223,429, filed Sep. 1, 2011.
Official Communication issued in International Patent Application No. PCT/JP2010/056559, mailed on Jul. 27, 2010.
Taniguchi et al.: "Antenna Device and Radio Frequency IC Device"; U.S. Appl. No. 13/232,102, filed Sep. 14, 2011.
Official Communication issued in International Patent Application No. PCT/JP2009/056934, mailed on Jun. 30, 2009.
Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.

(56) References Cited

OTHER PUBLICATIONS

Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099, filed Nov. 11, 2010.
Kato et al.: Wireless IC Device and Manufacturing Method Thereof; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.
Ikemoto et al.:"Radio IC Device"; U.S. Appl. No. 12/981,582, filed Dec. 30, 2010.
Official Communication issued in International Patent Application No. PCT/JP2009/062801, mailed on Oct. 27, 2009.
Ikemoto et al.: "Wireless IC Device and Electronic Apparatus"; U.S. Appl. No. 13/022,695, filed Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed on Mar. 25, 2008.
Osamura et al.: "Packaging Material With Electromagnetic Coupling Module,"; U.S. Appl. No. 12/536,663, filed Aug. 6, 2009.
Osamura et al.: "Packaging Material With Electromagnetic Coupling Module,"; U.S. Appl. No. 12/536,669, filed Aug. 6, 2009.
Dokai et al.: "Wireless IC Device and Component for Wireless IC Device,"; U.S. Appl. No. 12/543,553, filed Aug. 19, 2009.
Shioya et al.: "Wireless IC Device,"; U.S. Appl. No. 12/551,037, filed Aug. 31, 2009.
Ikemoto: "Wireless IC Device and Manufacturing Method Thereof,"; U.S. Appl. No. 12/579,672, filed Oct. 15, 2009.
Official communication issued in International Application No. PCT/JP2008/058614, mailed on Jun. 10, 2008.
Official Communication issued in International Patent Application No. PCT/JP2008/063025, mailed on Aug. 12, 2008.
Kato et al.: "Wireless IC Device,"; U.S. Appl. No. 12/603,608, filed Oct. 22, 2009.
Kato et al.: "Wireless IC Device,"; U.S. Appl. No. 12/688,072, filed Jan. 15, 2010.
Official Communication issued in International Patent Application No. PCT/JP2009/053693, mailed on Jun. 9, 2009.
Kato: "Composite Antenna,"; U.S. Appl. No. 12/845,846, filed Jul. 29, 2010.
Official Communication issued in International Patent Application No. PCT/JP2009/053690, mailed on Jun. 2, 2009.
Kato et al.: "Radio Frequency IC Device and Radio Communication System,"; U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device,"; U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device,"; U.S. Appl. No. 12/861,945, filed Aug. 24, 2010.
Kato: "Wireless IC Device and Electromagnetic Coupling Module,"; U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device"; U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.
Official Communication issued in corresponding European Patent Application No. 08 791 334.9, mailed on May 14, 2012.
Official Communication issued in corresponding European Patent Application No. 12195562.9, mailed on Jan. 22, 2013.
Official Communication issued in corresponding European Patent Application No. 12 195 562.9, mailed on Oct. 29, 2013.
Official Communication issued in corresponding Japanese Patent Application No. 2012-221761, mailed on May 13, 2014.
Kato et al.; "Radio IC Device"; U.S. Appl. No. 13/964,234, filed Aug. 12, 2013.
Official Communication issued in corresponding Japanese Patent Application No. 2012-221761, mailed on Jul. 14, 2015.
Official Communication issued in corresponding Japanese Patent Application No. 2014-163278, mailed on Apr. 21, 2015.
Official Communication issued in corresponding Japanese Patent Application No. 2015-118934, mailed on Jul. 26, 2016.

\* cited by examiner

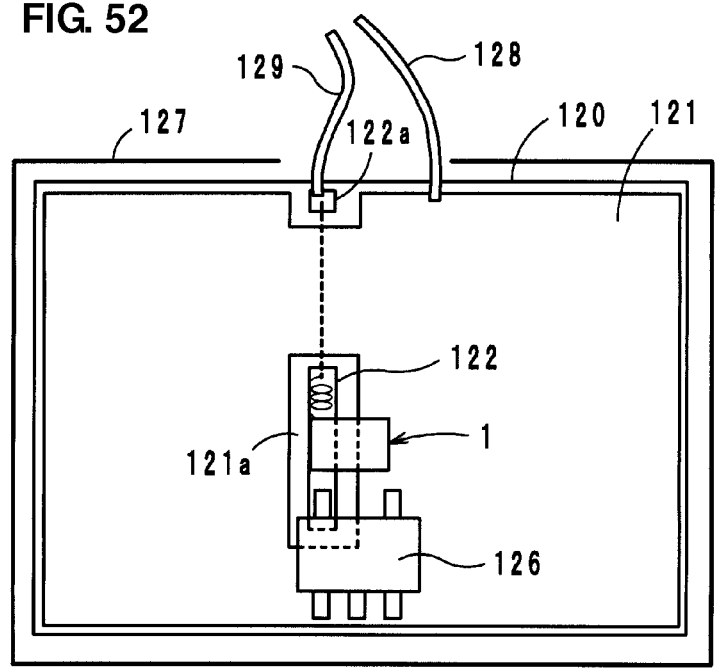
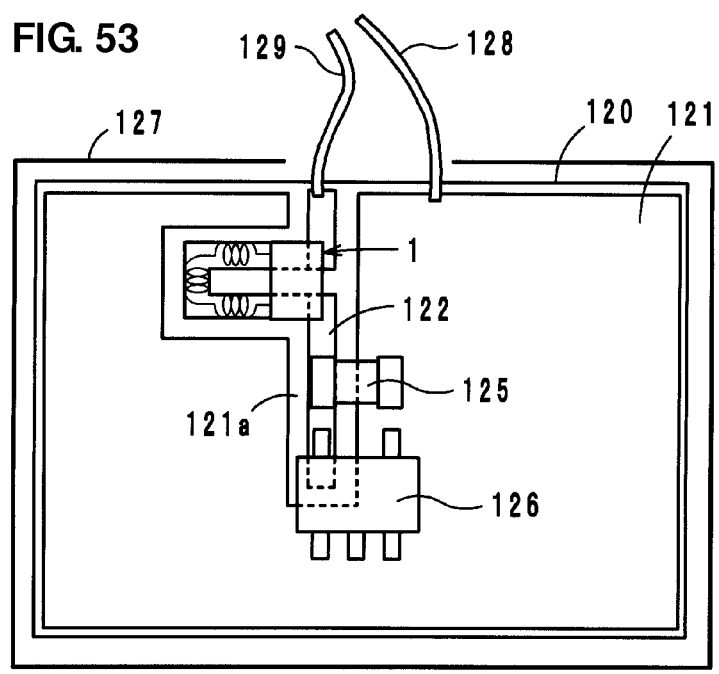

RADIO IC DEVICE

BACKGROUND OF THE INVENTION

1. Field of the Invention

The present invention relates to radio IC devices, and particularly to a radio IC device including a radio IC used for an RFID (Radio Frequency Identification) system.

2. Description of the Related Art

A RFID system has been developed for commodity management in recent years. In the RFID system, information is transmitted by non-contact communication between a reader/writer that generates an induction field and an IC chip (may be referred to as IC tag or radio IC chip) which stores commodity information and other information attached on the package or other item of the commodity.

Japanese Unexamined Patent Application Publication No. 2002-232221 discloses a transmitter/receiver unit including an IC chip-including radio IC device together with other chip components. In the transmitter/receiver unit, a circuit board on which the IC chip is mounted is enclosed in a shielding case, and an antenna element is further disposed on the circuit board.

However, since the antenna element is disposed as an independent component different from the radio IC chip within the shielding case, the radio IC device is relatively large and, consequently, the size of the transmitter/receiver unit is increased. In order to avoid the increase in size, the antenna element is miniaturized. However, this reduces the radiation characteristics of the antenna element, which causes problems, such as a decrease in communication distance.

SUMMARY OF THE INVENTION

To overcome the problems described above, preferred embodiments of the present invention provide a radio IC device that is miniaturized without reducing the radiation characteristics.

A radio IC device according to a preferred embodiment of the present invention includes a high frequency device defined by an electromagnetic coupling module or a radio IC chip, and a radiation plate arranged so as to be coupled to the high frequency device. The electromagnetic coupling module includes a radio IC arranged to process transmitted and received signals and a feed circuit board including a feed circuit having an inductance element connected to or electromagnetically coupled to the radio IC and coupled to an external circuit. The radiation electrode is preferably defined by a case of an apparatus and/or a metal component disposed in the apparatus, for example.

More specifically, the radio IC device includes a high frequency device and a radiation plate, and the high frequency device includes an electromagnetic coupling module or a radio IC chip. The electromagnetic coupling module may preferably include a feed circuit board including the radio IC, or a feed circuit board on which the radio IC is disposed. If the high frequency device is a radio IC chip, the radio IC chip and the radiation plate are coupled to each other with a coupling electrode, such as a loop electrode.

The metal component defining the radiation plate can be any metal portion, such as a wiring electrode disposed in an apparatus, a shielding case, a ground electrode, and a metal portion of a connector, or a metal case of a switching module used in the apparatus, for example.

The feed circuit board may preferably include a resonance circuit and/or a matching circuit. The radio IC is operated by a signal received by the radiation plate through the resonance circuit and/or the matching circuit, and the answer signal from the radio IC is radiated from the radiation plate to the outside through the resonance circuit and/or the matching circuit.

Since the case of the apparatus and/or any metal component in the apparatus can be used as the radiation plate, another component is not required to be provided as an antenna element. Consequently, the size of the apparatus is not increased. In addition, the metal components, such as the case, the wiring electrode, and the ground electrode are relatively large, and accordingly, desired radiation characteristics can be obtained. The apparatus used herein preferably refers to an electronic apparatus in which the radio IC device is to be mounted, such as cellular phone, for example. If the case of the apparatus is a shielding case made of a metal, the case can function as the radiation plate by itself. If the case is made of a non-conductive material, an electroconductive electrode film can be formed on the case so that the electrode film functions as the radiation plate.

In the radio IC device, a miniature radio IC chip can easily be mounted on a small feed circuit board by providing an electromagnetic coupling module including a radio IC chip disposed on a feed circuit board. If the radio IC is modified according to the working frequency of the RFID system, all that is required is to modify the design of the feed circuit of the feed circuit board. It is not necessary to change the shape, size or arrangement of the radiation plate or the coupling state between the radiation plate and the feed circuit board.

The radio IC device according to preferred embodiments of the present invention does not require that an antenna element be disposed as an additional independent component. Thus, the radio IC device and apparatuses including the radio IC device can be miniaturized without degrading the radiation characteristics. The feed circuit board can have a relatively small size. Accordingly, even a very small radio IC chip can be easily mounted on the small feed circuit board with a conventionally used IC mounter. Consequently, the packaging cost is reduced. All that is required to change the working frequency is to modify the design of the feed circuit.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 52 is a plan view of a radio IC device according to another preferred embodiment of the present invention.

FIG. 53 is a plan view of a radio IC device according to another preferred embodiment of the present invention.

DETAILED DESCRIPTION OF PREFERRED EMBODIMENTS

Figure 1:
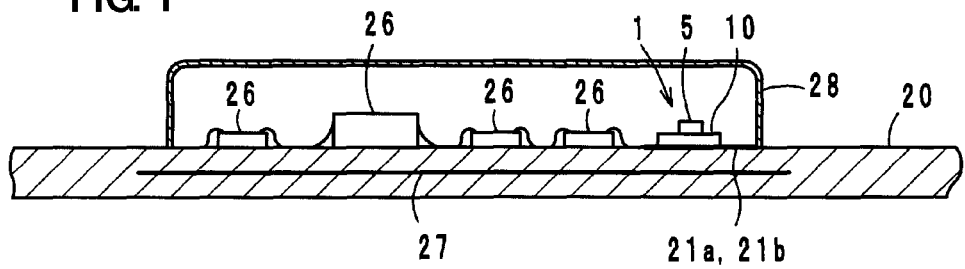
FIG. 1 is a sectional view of a radio IC device according to a preferred embodiment of the present invention.

Preferred embodiments of the radio IC device according to the present invention will now be described with reference to the attached drawings. The same elements and portions in the drawings are designated by the same reference numerals, and the same description is not repeated.

First Preferred Embodiment

FIG. 1 shows portions of an electronic apparatus including a radio IC device according to a first preferred embodiment of the present invention. The electronic apparatus includes a printed wiring board 20 on which an electromagnetic coupling module 1 and other electronic components 26, such as a chip resistor and a chip capacitor, for example, are mounted. The printed wiring board also includes a shielding electrode 27 therein.

Figure 2:
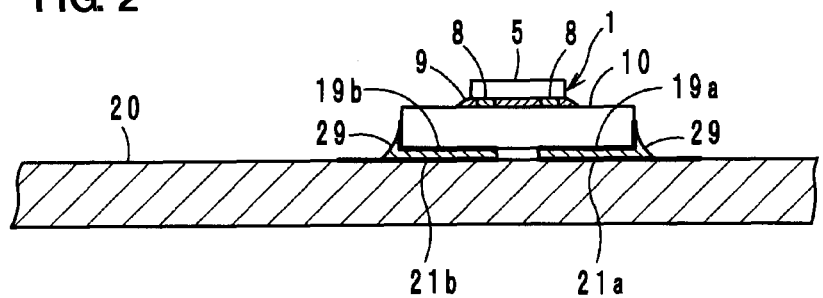
FIG. 2 is a sectional view showing the connection between an electromagnetic coupling module and a wiring electrode.
Figure 4:
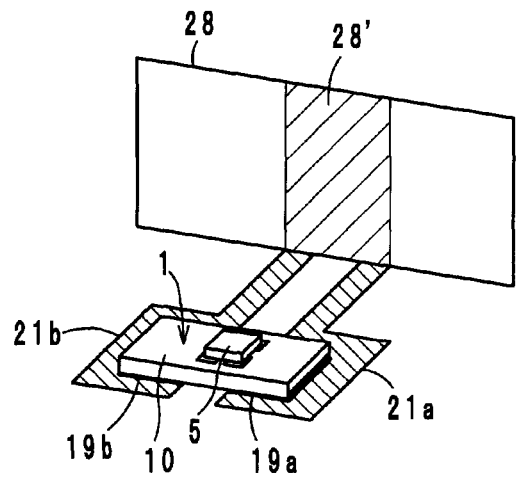
FIG. 4 is a perspective view showing the connection between the wiring electrode and a case.

The electromagnetic coupling module 1 preferably includes a radio IC chip 5 processing a transmitted/received signal having a predetermined frequency and a feed circuit board 10 on which the radio IC chip 5 is disposed, as shown in FIG. 2. A shielding case 28 of an apparatus also defines a radiation plate that functions as an antenna element, and is electrically connected to second wiring electrodes 21a and 21b (see FIGS. 2 and 4) magnetically coupled to the electromagnetic coupling module 1 on the printed wiring board 20. The electromagnetic coupling module 1 and the radiation plate (shielding case 28) define the radio IC device.

Figure 3:
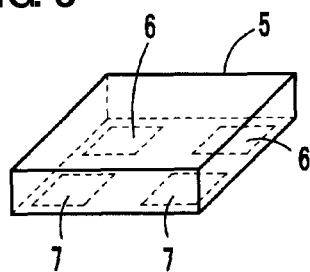
FIG. 3 is a perspective view of a radio IC chip.

The radio IC chip 5 preferably includes a clock circuit, a logic circuit, a memory circuit and other circuit elements, and stores necessary information. On the rear surface of the radio IC chip, input/output terminal electrodes 6 and packaging terminal electrodes 7 are disposed, as shown in FIG. 3. The input/output terminal electrodes 6 are electrically connected to electrodes 12a and 12b (see FIGS. 7 and 8) disposed on the surface of the feed circuit board 10 preferably through metal bumps 8, for example. The packaging terminal electrodes 7 are electrically connected to electrodes 12c and 12d through the metal bumps 8. The material of the metal bumps 8 can preferably be Au, Ag, solder or other suitable material, for example.

A protective film 9 is provided between the surface of the feed circuit board 10 and the rear surface of the radio IC chip 5 to improve the bonding strength between the feed circuit board 10 and the radio IC chip 5 and to protect the bumps 8.

The shielding case 28 is preferably made of a metal and arranged so as to cover the electromagnetic coupling module 1 and the electronic components 26 on the printed wiring board 20. In addition, the shielding case functions as a radiation plate of the electromagnetic coupling module 1, as will be described below. If the case 28 is made of a nonconductive material, an electroconductive electrode film 28' is preferably formed on the internal surface of the case 28, as indicated by oblique lines shown in FIG. 4, and the electrode film 28' functions as the radiation plate.

The feed circuit board 10 includes a feed circuit (including a resonance circuit having an inductance element and a matching circuit, not shown in FIG. 2), and is provided with external electrodes 19a and 19b from the rear surface to the sides. Also, the connection electrodes 12a and 12d (see FIGS. 7 and 8) are provided on the surface of the feed circuit board 10. The external electrodes 19a and 19b are electromagnetically coupled to the resonance circuit included in the feed circuit board 10 and electrically connected to the second wiring electrodes 21a and 21b with an electroconductive adhesive 29. The electrical connection may preferably be established by soldering, for example.

More specifically, the feed circuit board 10 includes a resonance circuit having a predetermined resonance frequency that transmits a signal having the predetermined frequency generated from the radio IC chip 5 to the shielding case 28 (or the electrode film 28') through the external electrodes 19a and 19b and the wiring electrodes 21a and 21b, and supplies a signal having the predetermined frequency selected from the signals received by the shielding case 28 (or the electrode film 28') to the radio IC chip 5. In the radio IC device, the radio IC chip 5 operates according to the signal received by the shielding case (or the electrode film 28'), and an answer signal from the radio IC chip 5 is radiated from the shielding case 28 (or the electrode film 28').

In the electromagnetic coupling module 1, the external electrodes 19a and 19b disposed on the surface of the feed circuit board 10 are electromagnetically coupled to the resonance circuit included in the feed circuit board 10 and electrically connected to the shielding case 28 which functions as an antenna. The electromagnetic coupling module 1 does not require a separate, relatively large antenna element, and accordingly the electromagnetic coupling module can be very small. Since the feed circuit board 10 has been miniaturized, the radio IC chip 5 can preferably be mounted on a miniaturized feed circuit board 10 by a conventionally used IC mounter or other suitable mounter, for example, and thus, the packaging cost can be reduced. All that is required to change the working frequency is to modify the design of the feed circuit, and the shielding case 28 may be used without being modified. The shielding case 28 is relatively large and can ensure desired radiation characteristics.

Preferably, the electroconductive adhesive 29 used to bond the external electrodes 19a and 19b with the second wiring electrodes 21a and 21b includes metal particles. Such an adhesive 29 exhibits a small difference in thermal expansion from the external electrodes 19 and 19b and the wiring electrodes 21a and 21b when undergoing temperature changes, and accordingly, the bonding reliability is improved.

The second wiring electrodes 21a and 21b may be provided within the printed wiring board 20. In this instance, the second wiring electrodes 21a and 21b are electrically connected to the electrodes on the surface of the wiring board 20 through a known via hole conductor. The printed wiring board 20 may preferably be a ceramic multilayer substrate or a resin substrate, for example.

Second Preferred Embodiment

Figure 5:
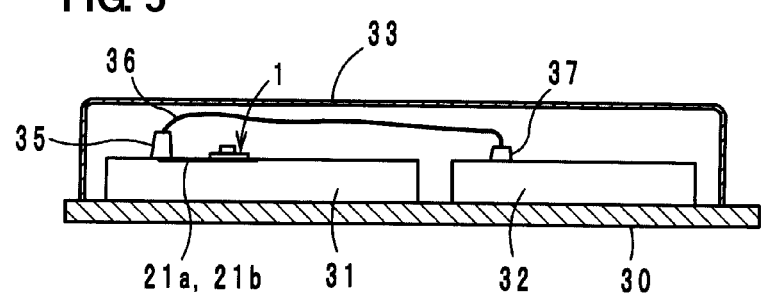
FIG. 5 is a sectional view of a radio IC device according to another preferred embodiment of the present invention.

FIG. 5 shows essential portions of an electronic apparatus including a radio IC device according to a second preferred embodiment of the present invention. The electronic apparatus includes a plurality of printed wiring boards 31 and 32 covered with a case 33. The printed wiring boards 31 and 32 are disposed on a substrate 30. One printed wiring board 31 is provided with an electromagnetic coupling module 1 and other electronic components thereon, and the other printed wiring board 32 is provided with other electronic components thereon.

Figure 6:
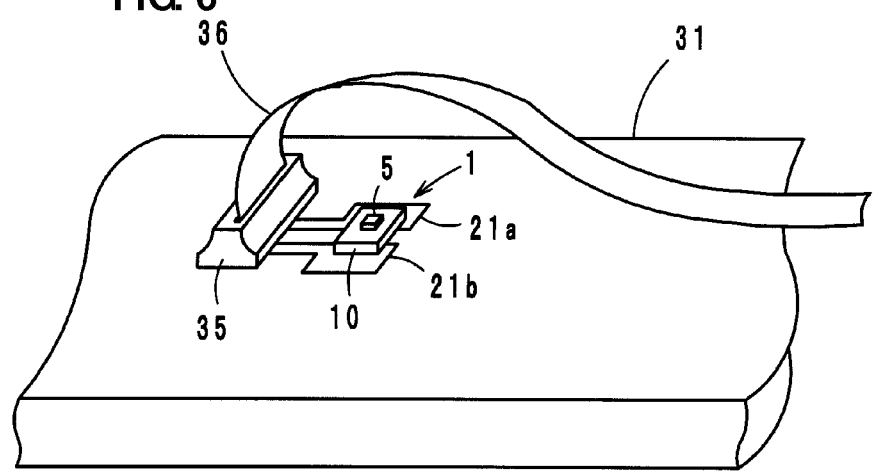
FIG. 6 is a perspective view showing the connection from an electromagnetic coupling module and a wiring case.

In the electromagnetic coupling module 1, the external electrodes 19a and 19b (see FIG. 2) of the electromagnetic coupling module 1 are electrically connected to second wiring electrodes 21a and 21b disposed on the printed wiring board 31, as shown in FIG. 6. The wiring electrodes 21a and 21b are connected to one end of a wiring cable 36 defining a first wiring electrode provided to a known wiring connector 35. The other end of the wiring cable 36 is fixed to a securing member 37 disposed on the printed wiring board 32 and is electrically open.

In the second preferred embodiment, the wiring cable 36 between the wiring boards 31 and 32 functions as a radiation plate of the electromagnetic coupling module 1. Thus, an RFID system is defined, and transmits and receives high-frequency signals to and from a reader/writer. Thus, the same effects are produced as in the first preferred embodiment.

First Preferred Embodiment of Resonance Circuit

Figure 7:
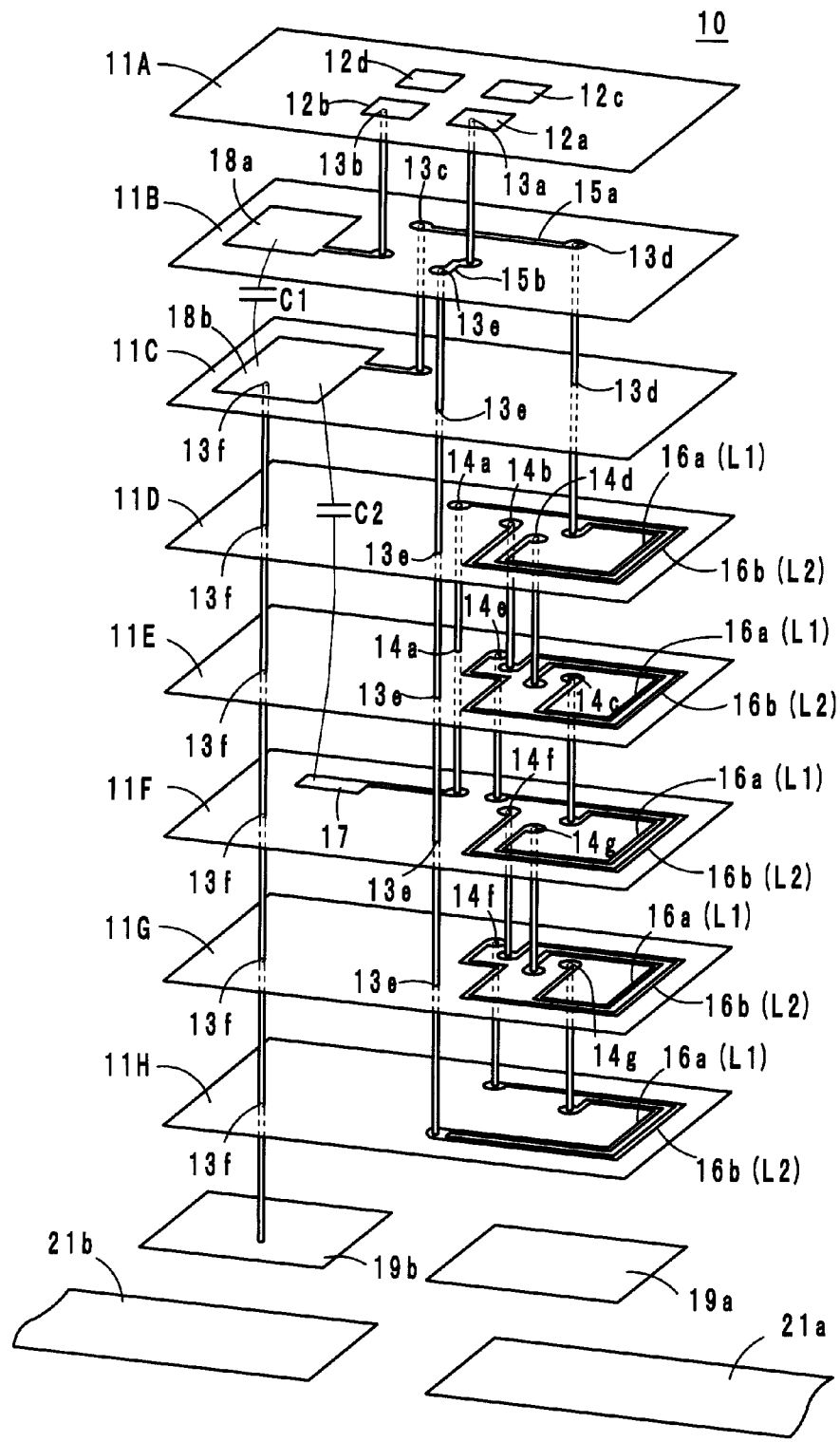
FIG. 7 is an exploded perspective view of a feed circuit board including a resonance circuit according to a preferred embodiment of the present invention.

FIG. 7 shows a resonance circuit according to a first preferred embodiment, in which the feed circuit board 10 includes the resonance circuit. The feed circuit board 10 is preferably prepared by stacking dielectric ceramic sheets 11A to 11H, and pressing and firing the stack. The sheet 11A is provided with connection electrodes 12a and 12b, electrodes 12c and 12d, and via hole conductors 13a and 13b. The sheet 11B is provided with a capacitor electrode 18a, conductor patterns 15a and 15b, and via hole conductors 13c to 13e. The sheet 11C is provided with a capacitor electrode 18b and via hole conductors 13d to 13f. The sheet 11D is provided with conductor patterns 16a and 16b and via hole conductors 13e, 13f, 14a, 14b and 14d. The sheet 11E is provided with conductor patterns 16a and 16b and via hole conductors 13e, 13f, 14a, 14c and 14e. The sheet 11F is provided with a capacitor electrode 17, conductor patterns 16a and 16b and via hole conductors 13e, 13f, 14f and 14g. The sheet 11G is provided with conductor patterns 16a and 16b and via hole conductors 13e, 13f, 14f and 14g. The sheet 11H is provided with conductor patterns 16a and 16b and a via hole conductor 13f.

By stacking these sheets 11A to 11H, a conductor pattern 16a is preferably provided in a spiral arrangement, for example, continuing through the via hole conductors 14c, 14d and 14g, thus defining an inductance element L1, and a conductor pattern 16b is preferably provided in a spiral arrangement, for example, continuing through the via hole conductors 14b, 14e and 14f, thus defining an inductance element L2. Also, a capacitance element C1 is defined by capacitor electrodes 18a and 18b, and a capacitance element C2 is defined by capacitor electrodes 18b and 17.

One end of the inductance element L1 is connected to the capacitor electrode 18b through the via hole conductor 13d, conductor pattern 15a and the via hole conductor 13c, and one end of the inductance element L2 is connected to the capacitor electrode 17 through the via hole conductor 14a. The other ends of the inductance elements L1 and L2 are brought together on the sheet 11H and connected to the connection electrode 12a through the via hole conductor 13e, the conductor pattern 15b and the via hole conductor 13a. In addition, the capacitor electrode 18a is electrically connected to the connection electrode 12b through the via hole conductor 13b.

The connection electrodes 12a and 12b are electrically connected to the input/output terminal electrodes 6 (see FIG. 3) of the radio IC chip 5 through the metal bumps 8 (see FIG. 2). The electrodes 12c and 12d are connected to the packing terminal electrodes 7 of the radio IC chip 5.

In addition, the external electrodes 19a and 19b are provided on the rear surface of the feed circuit board 10 preferably by applying a conductive paste, for example. The external electrode 19a is coupled to the inductance elements L (L1 and L2) by a magnetic field, and the external electrode 19b is connected to the capacitor electrode 18b through the via hole conductor 13f. The external electrodes 19a and 19b are electrically connected to the wiring electrodes 21a and 21b, as described above.

In the resonance circuit, the inductance elements L1 and L2 are arranged such that two conductor patterns 16a and 16b are disposed in parallel or substantially in parallel. The two conductor patterns 16a and 16b preferably have different line lengths from each other so as to have different resonance frequencies. Thus, the radio IC device can be used for a wide range of frequencies.

The ceramic sheets 11A to 11H may be made of a magnetic ceramic material, and the feed circuit board 10 can be easily produced by a known process for forming a multilayer substrate, such as stacking sheets or printing into a thick film, for example.

The sheets 11A to 11H may preferably be flexible sheets made of, for example, a dielectric material such as polyimide or liquid crystal polymer. Electrodes or conductors are formed on such flexible sheets by a thick film forming process, for example, and then the sheets are stacked one on top of another and thermally compressed into a multilayer composite. Thus, the inductance elements L1 and L2 and the capacitance elements C1 and C2 may be disposed within the circuit board.

In the feed circuit board 10, the inductance elements L1 and L2 and the capacitance elements C1 and C2 are disposed at different positions when viewed from above. The inductance elements L1 and L2 are coupled to the external electrode 19a (wiring electrode 21a) by a magnetic field, and the capacitance element C1 is coupled to the external electrode 19b (wiring electrode 21b) by an electric field.

Thus, the electromagnetic coupling module 1 including the radio IC chip 5 on the feed circuit board 10 receives high-frequency signals (for example, UHF frequencies) radiated from a reader/writer (not shown) with a shielding case 28 or a wiring cable 36, so that the resonance circuit coupled to the external electrodes 19a and 19b through the wiring electrodes 21a and 21b by a magnetic field and an electric field resonates to supply only a received signal having a predetermined frequency to the radio IC chip 5. A predetermined energy is extracted from the received signal. The energy is used as a driving source to match the information stored in the radio IC chip 5 with a predetermined frequency by a resonance circuit, and to transmit the information to the shielding case 28 or the wiring cable 36 through the external electrodes 19a and 19b and the wiring electrodes 21a and 21b, and further transmit or transfer the information to the reader/writer from the case 28 or the cable 36.

The resonance frequency characteristics of the feed circuit board 10 depend on the resonance circuit including the inductance elements L1 and L2 and the capacitance elements C1 and C2. The resonance frequency of the signal radiated from the shielding case 28 or the wiring cable 36 substantially depends on the self resonant frequency of the resonance circuit. It is accordingly not necessary to redesign the resonance circuit even if the shielding case 28 or the wiring cable 36 is changed in shape or material. Thus, the resonance circuit can be applied to various electronic apparatuses.

The resonance circuit preferably also defines a matching circuit to match the impedances between the radio IC chip 5 and the radiation plate (shielding case 28 or wiring cable 36). The feed circuit board 10 may preferably include a matching circuit provided in addition to the resonance circuit including the inductance elements and the capacitance elements (in this sense, the resonance circuit may be referred to as matching circuit). The design for a resonance circuit also defining a matching circuit tends to be complicated. A structure in which a matching circuit is provided separately from the resonance circuit enables the resonance circuit and the matching circuit to be independently designed. The resonance circuit may be replaced with a matching circuit. The resonance circuit may be designed in view of the shape and size of the radiation plate, or the shielding case 28 or the wiring cable 36. Although this requires that the feed circuit board 10 be precisely mounted at a correct position, the radiation characteristics of the resulting radio IC device can be improved.

Second Preferred Embodiment of Resonance Circuit

Figure 8:
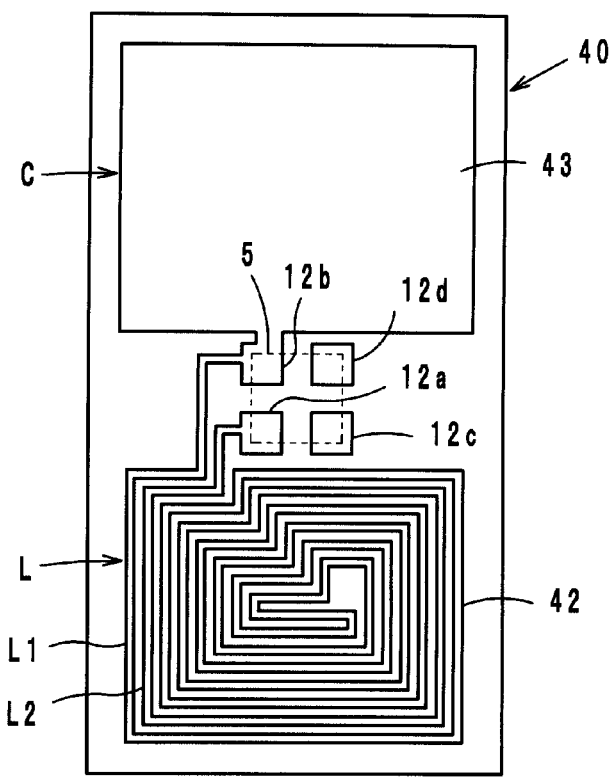
FIG. 8 is a plan view a feed circuit board including a resonance circuit according to another preferred embodiment of the present invention.

FIG. 8 shows a resonance circuit according to a second preferred embodiment, in which the resonance circuit is disposed on a feed circuit board 40. This feed circuit board 40 is preferably made of a flexible PET film, for example, and on which a spiral conductor pattern 42 defining inductance elements L and a capacitor electrode 43 defining a capacitance element C are disposed. Electrodes 12a and 12b extending from the conductor pattern 42 and the capacitor electrode 43 are electrically connected to the terminal electrodes 6 of the radio IC chip 5. Electrodes 12c and 12d provided on the circuit board define terminal ground electrodes and are electrically connected to the terminal electrodes 7 of the radio IC chip 5.

The feed circuit board 40 is substantially the same as that of the first preferred embodiment in that the inductance elements L and the capacitance element C define a resonance circuit and are coupled to the respectively opposing second wiring electrodes 21a and 21b by a magnetic field and an electric field to transmit and receive a high-frequency signal having a predetermined frequency. In the second preferred embodiment, in particular, the feed circuit board 40 made of a flexible film produces a thin electromagnetic coupling module 1. The inductances of the inductance elements L can be varied by varying the line width and/or the line pitch of the conductor pattern 42, and thus the resonance frequency can be precisely adjusted.

In the second preferred embodiment, the conductor pattern 42 defining the inductance elements L preferably includes two spiral lines that are connected to each other at the approximate center of the spirals. The two lines of the conductor pattern 42 have respective inductances L1 and L2 and their resonance frequencies can be set to different values. Thus, the resulting radio IC device can be used in a wide range of frequencies as that of the first preferred embodiment.

Third Preferred Embodiment

Figure 9:
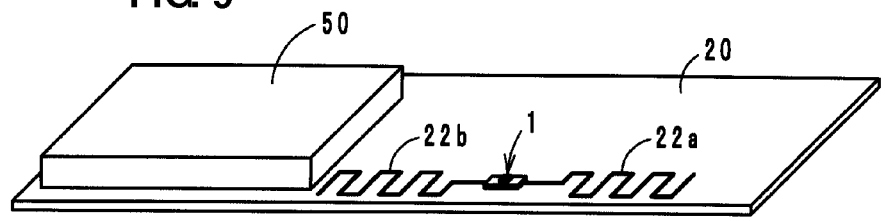
FIG. 9 is a perspective view of a radio IC device according to another preferred embodiment of the present invention.

In the radio IC device according to a third preferred embodiment, second wiring electrodes 22a and 22b are preferably configured in a meandering arrangement on the printed wiring board 20 of an electronic apparatus. The electromagnetic coupling module 1 is mounted on one end of each of the wiring electrodes 22a and 22b, as shown in FIG. 9. A metal case 50 of a battery or liquid crystal panel is disposed close to the electrode 22b on the printed wiring board 20. The electromagnetic coupling module 1 is coupled to the wiring electrodes 22a and 22b in substantially the same manner as in the first and second preferred embodiments.

In the third preferred embodiment, the second wiring electrodes 22a and 22b function as the radiation plate, and the metal case 50 via the wiring electrode 22b is coupled to the wiring electrode 22b to function as the radiation palate. The wiring electrodes 22a and 22b themselves may function as the radiation plate, and, in addition, the metal case 50 is also used as the radiation plate. Consequently, the radiation characteristics and the antenna gain are improved. The radio IC device of the third preferred embodiment can function without the metal case 50. By matching the resonance frequency of the metal case 50 to the working frequency of the radio IC device, the antenna gain can be further improved.

Fourth Preferred Embodiment

Figure 10:
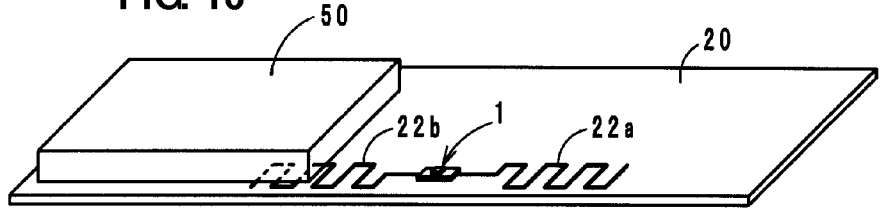
FIG. 10 is a perspective view of a radio IC device according to another preferred embodiment of the present invention.

The radio IC device according to a fourth preferred embodiment has substantially the same structure as that of the third preferred embodiment, except that a portion of the metal case 50 used in the third preferred embodiment is disposed on the wiring electrode 22b, as shown in FIG. 10. The fourth preferred embodiment produces substantially the same effects as the third preferred embodiment. Since the metal case 50 overlaps the wiring electrode 22b, particularly, the degree of their coupling is increased.

Fifth Preferred Embodiment

Figure 11:
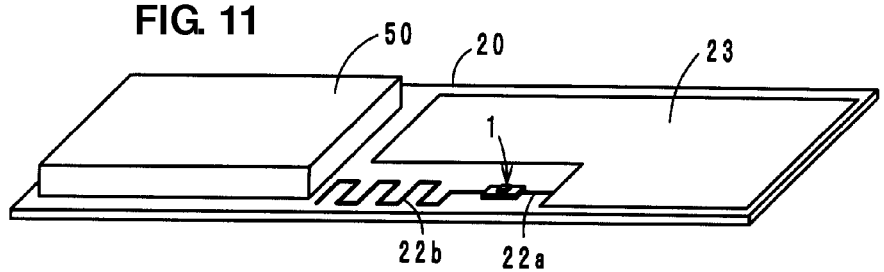
FIG. 11 is a perspective view of a radio IC device according to another preferred embodiment of the present invention.

In the radio IC device according to a fifth preferred embodiment, the wiring electrode 22a is electrically connected to a ground electrode 23 disposed on the printed wiring board 20, and the other wiring electrode 22b is disposed close to the metal case 50, as shown in FIG. 11.

The ground electrode 23 may be included in the printed wiring board 20. In this instance, the wiring electrode 22a may be connected to the ground electrode 23 through a via-hole conductor, or may be configured to have a meandering arrangement as shown in FIG. 9 and overlap the ground electrode 23.

In the fifth preferred embodiment, the wiring electrode 22b and the metal case 50 function as a radiation plate, and, in addition, the ground electrode 23 connected to the wiring electrode 22a also function as a radiation plate. Since the ground electrode 23 has a large area, the radiation characteristics and the antenna gain are improved.

Sixth Preferred Embodiment

Figure 12:
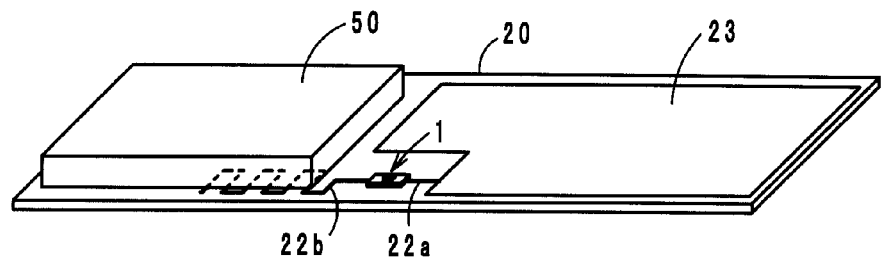
FIG. 12 is a perspective view of a radio IC device according to another preferred embodiment of the present invention.

The radio IC device according to a sixth preferred embodiment has substantially the same structure as that of the fifth preferred embodiment except that a portion of the metal case 50 used in the fifth preferred embodiment is disposed on the wiring electrode 22b, as shown in FIG. 12. The sixth preferred embodiment produces substantially the same effects as the fifth preferred embodiment. Since the metal case 50 overlaps the wiring electrode 22b, particularly the degree of their coupling is increased.

Seventh Preferred Embodiment

Figure 13:
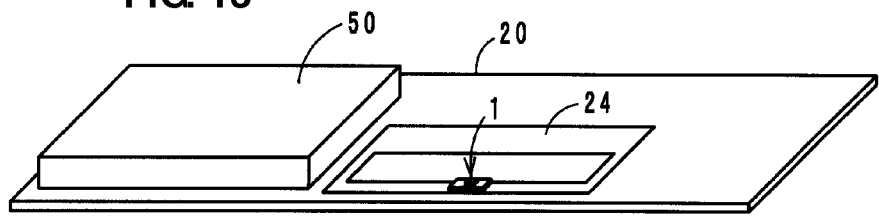
FIG. 13 is a perspective view of a radio IC device according to another preferred embodiment of the present invention.

In the radio IC device according to a seventh preferred embodiment, a loop electrode 24 defining the second wiring electrode is disposed on the printed wiring board 20, and the electromagnetic coupling module 1 is disposed on both ends of the line of the loop electrode 24, as shown in FIG. 13. The metal case 50 is disposed close to the loop electrode 24 on the printed wiring board 20. The electromagnetic coupling module 1 is coupled to the loop electrodes 24 in substantially the same manner as in the first and the second preferred embodiment.

In the seventh preferred embodiment, the loop electrode 24 functions as a radiation plate, and the metal case coupled to the loop electrode 24 also functions as a radiation plate. In particular, the loop electrode 24 can match the impedances between the radio IC chip 5 and the radiation plate, and thus improves the signal transmission efficiency between the radio IC chip 5 and the radiation plate without requiring an additional matching portion.

Eight Preferred Embodiment

Figure 14:
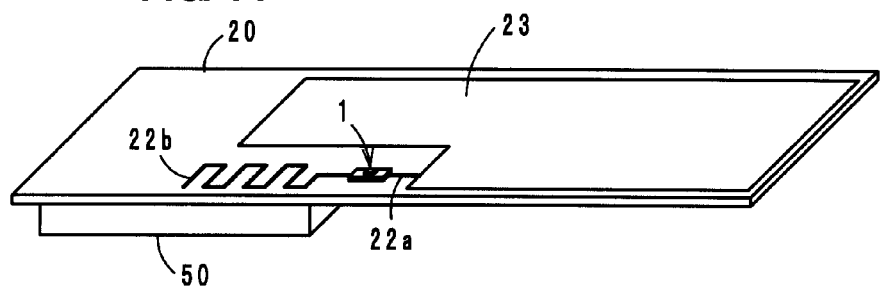
FIG. 14 is a perspective view of a radio IC device according to another preferred embodiment of the present invention.

In the radio IC device according to an eighth preferred embodiment, the metal case 50 used in the sixth preferred embodiment (see FIG. 12) is disposed on the rear surface of the printed wiring board 20, as shown in FIG. 14. A portion of the metal case 50 is coupled to the wiring electrode 22b with the printed wiring board 20 therebetween. The other structure is substantially the same as in the sixth preferred embodiment. The eighth preferred embodiment produces substantially the same effects as the sixth preferred embodiment. Since the metal case 50 is disposed on the rear surface of the printed wiring board 20, the ground electrode 23 can be provided with a large area.

Ninth Preferred Embodiment

Figure 15:
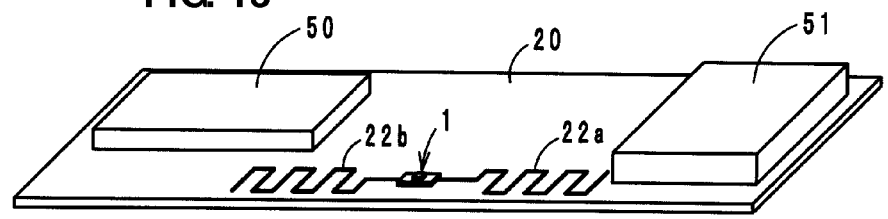
FIG. 15 is a perspective view of a radio IC device according to another preferred embodiment of the present invention.

In the radio IC device according to a ninth preferred embodiment, another metal case 51 is included close to the wiring electrode 22a on the surface of the printed wiring board 20 of the third preferred embodiment (see FIG. 9), as shown in FIG. 15. The metal case 51 is coupled to the wiring electrode 22a to function as a radiation plate, and, thus, the antenna gain is further improved.

Tenth Preferred Embodiment

Figure 16:
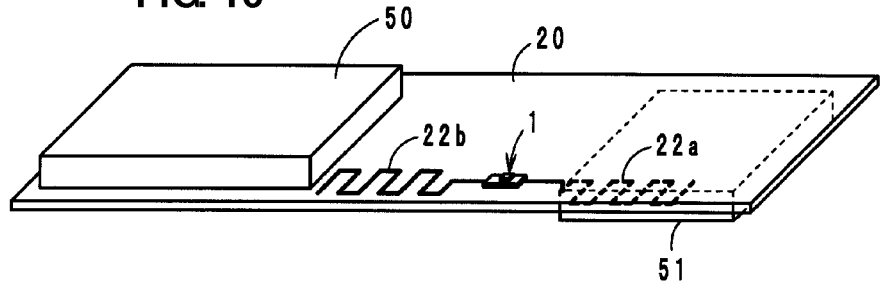
FIG. 16 is a perspective view of a radio IC device according to another preferred embodiment of the present invention.

In the radio IC device according to a tenth preferred embodiment, the metal case 51 used in the ninth preferred embodiment is disposed on the rear surface of the printed wiring board 20, as shown in FIG. 16. In this instance, the metal case is coupled to the wiring electrode 22a with the printed wiring board 20 therebetween.

Eleventh Preferred Embodiment

Figure 17:
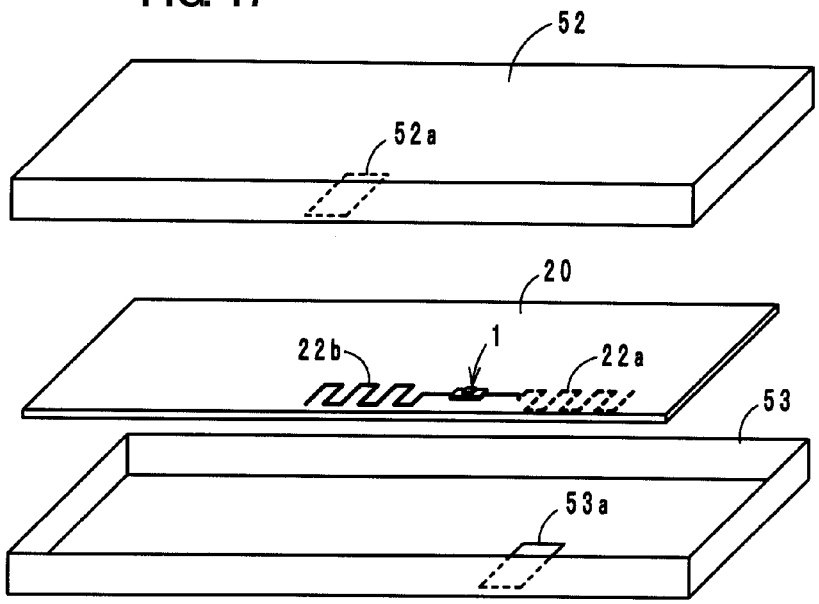
FIG. 17 is an exploded perspective view of a radio IC device according to another preferred embodiment of the present invention.
Figure 18:
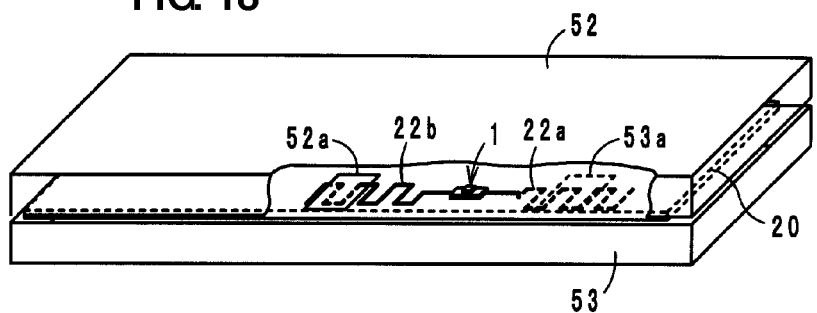
FIG. 18 is a perspective view of the preferred embodiment shown in FIG. 17.

In the radio IC device according to an eleventh preferred embodiment, the printed wiring board 20 is enclosed by an upper and a lower metal case 52 and 53, as shown in FIGS. 17 and 18, and the metal cases 52 and 53 function as radiation plates. Wiring electrodes 22a and 22b are provided on the printed wiring board 20 and coupled to the electromagnetic coupling module 1. The wiring electrode 22a is disposed on the rear side and connected to the front side through a via hole conductor. The wiring electrode 22b is disposed on the front side.

Figure 19:
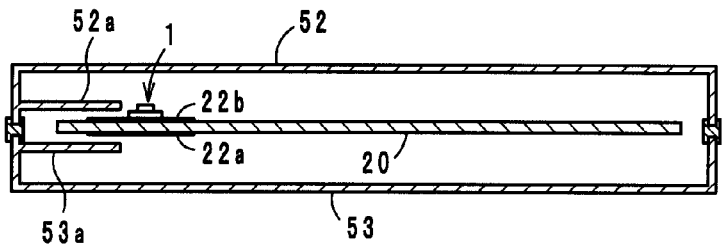
FIG. 19 is a sectional view of the preferred embodiment shown in FIG. 17.

As shown in FIG. 19, in addition, the metal case 52 has a coupling conductor 52a to enable the metal case 52 to couple efficiently to the wiring electrode 22b, and the metal case 53 has a coupling conductor 53a to enable the metal case 53 to couple efficiently to the wiring electrode 22a.

In the eleventh preferred embodiment, the wiring electrodes 22a and 22b function as radiation plates, and the metal cases 52 and 53 coupled to the respective wiring electrodes 22a and 22b also function as the radiation plates. Thus, the radiation characteristics and the antenna gain are improved.

Twelfth Preferred Embodiment

Figure 20:
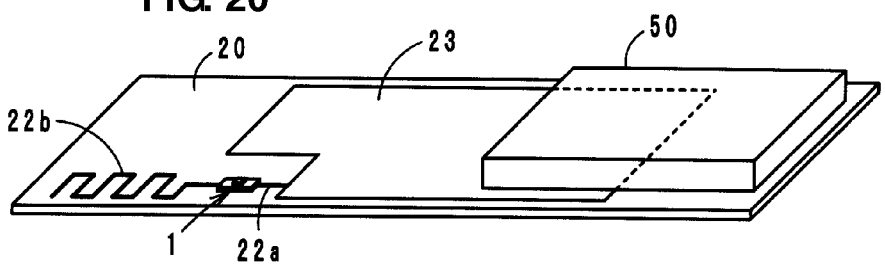
FIG. 20 is a perspective view of a radio IC device according to another preferred embodiment of the present invention.

In the radio IC device according to a twelfth preferred embodiment, a portion of the metal case 50 is disposed on the ground electrode 23 connected to the wiring electrode 22a as in the fifth preferred embodiment (see FIG. 11), as shown in FIG. 20. The ground electrode 23 and the metal case 50 are coupled to each other to function as a radiation plate.

Thirteenth Preferred Embodiment

Figure 21:
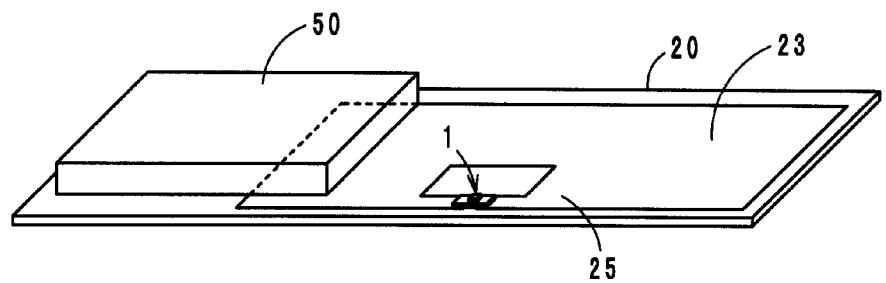
FIG. 21 is a perspective view of a radio IC device according to another preferred embodiment of the present invention.

In the radio IC device according to a thirteenth preferred embodiment, the area of the loop electrode 25 provided as the second wiring electrode is increased as shown in FIG. 21 so that the loop electrode 25 can be used as a ground electrode 23 or a power supply electrode. The metal case 50 is disposed on a portion of the loop electrode 25. In the thirteenth preferred embodiment, the loop electrode 25 and the metal case 50 function as a radiation plate.

Fourteenth Preferred Embodiment

Figure 22:
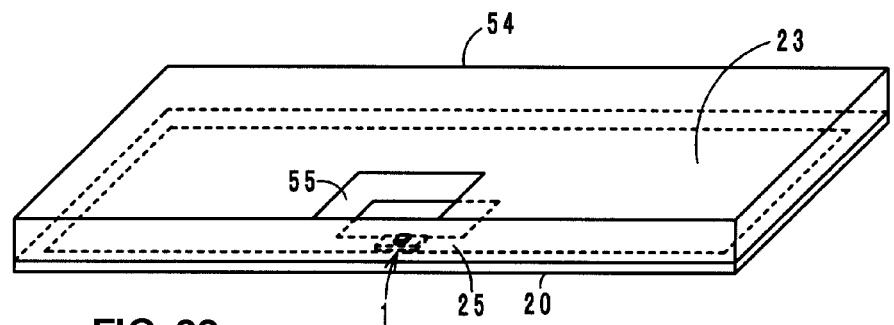
FIG. 22 is a perspective view of a radio IC device according to another preferred embodiment of the present invention.

In the radio IC device according to a fourteenth preferred embodiment, the loop electrode 25 provided as the second wiring electrode and the ground electrode 23 are integrated to function as a radiation plate, and a metal case 54 electrically connected to the ground electrode 23 is disposed on the printed wiring board 20 so as to cover the radiation plate, as shown in FIG. 22. The metal case 54 has a notch 55 in a region corresponding to the loop electrode 25 when viewed from above. Since a magnetic field is generated around the loop electrode 25, the magnetic field is radiated out of the metal case 54 through the notch 55 over the loop electrode 25. Thus, the radiation characteristics are improved. The metal case 54 may be disposed so as to cover at least one of other electronic components (not shown).

Fifteenth Preferred Embodiment

Figure 23:
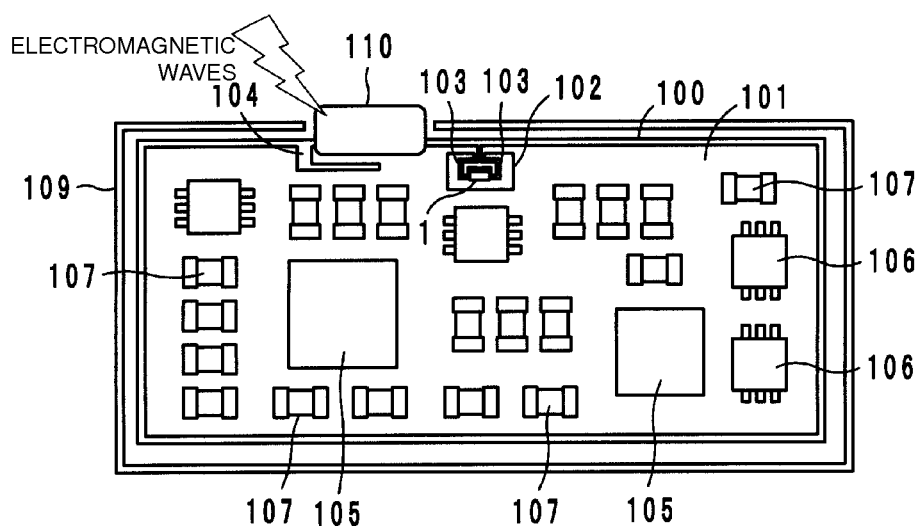
FIG. 23 is a plan view of a radio IC device according to another preferred embodiment of the present invention.

In the radio IC device according to a fifteenth preferred embodiment, a ground electrode 101 including an opening 102 is disposed on a printed wiring board 100, and a pair of loop electrodes 103 functioning as inductance elements are provided in the opening 102, as shown in FIG. 23. The electromagnetic coupling module 1 (or radio IC chip 5 alone) is coupled to the end of each loop electrode 103. The printed wiring board 100 includes switching modules 105, ICs 106, and other elements 107, such as chip resistors and chip capacitors thereon. The printed wiring board 100 is covered with a shielding case 109.

A USB connector 110 is connected to the printed wiring board 100. The metal portion of the connector 110 is electrically connected to the ground electrode 101 and functions as a radiation plate of the electromagnetic coupling module 1. The ground electrode 101 includes a slit 104 in the vicinity of the connector 110, so that electromagnetic waves through the connector 110 can efficiently propagate to the loop electrodes 103.

Figure 24:
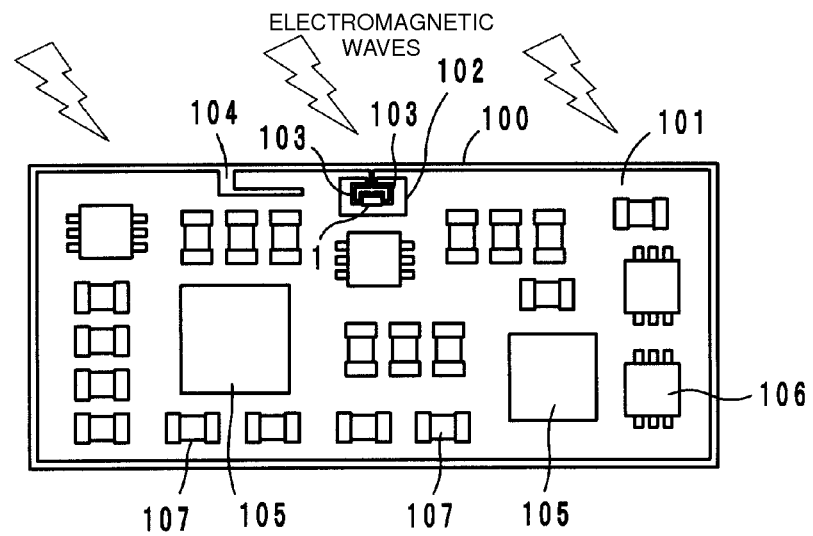
FIG. 24 is a plan view of the radio IC device according to the preferred embodiment shown in FIG. 23 in the course of manufacture.

FIG. 24 shows a state before the shielding case 109 and the connector 110 are disposed on the printed wiring board 100. In this state, the ground electrode 101 functions as a radiation plate. Thus, the structure of the fifteenth preferred embodiment can function as a radio IC device from a stage shown in FIG. 24 to the final stage shown in FIG. 23 of the manufacturing process.

Sixteenth Preferred Embodiment

Figure 25:
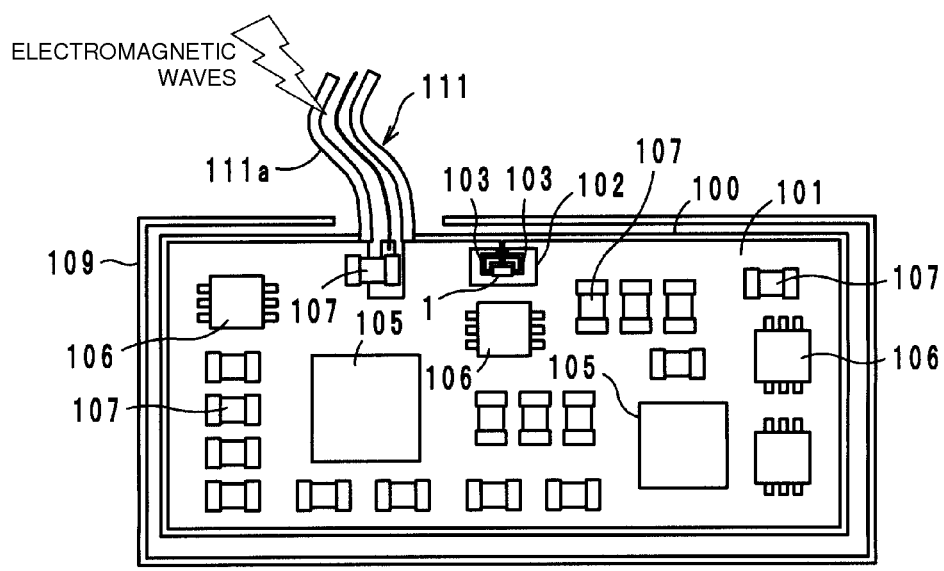
FIG. 25 is a plan view of a radio IC device according to another preferred embodiment of the present invention.

In the radio IC device according to a sixteenth preferred embodiment, the shielding wire 111a of a coaxial cable (power supply cable) 111 is electrically connected to the ground electrode 101 disposed on the printed wiring board 100, as shown in FIG. 25. The other structure is substantially the same as in the fifteenth preferred embodiment.

In the sixteenth preferred embodiment, the shielding wire 111a of the coaxial cable 111 electrically connected to the ground electrode 101 functions as a radiation plate of the electromagnetic coupling module 1. Since the shielding wire 111a is relatively long, communication can be performed even with weak electromagnetic waves.

Seventeenth Preferred Embodiment

Figure 26:
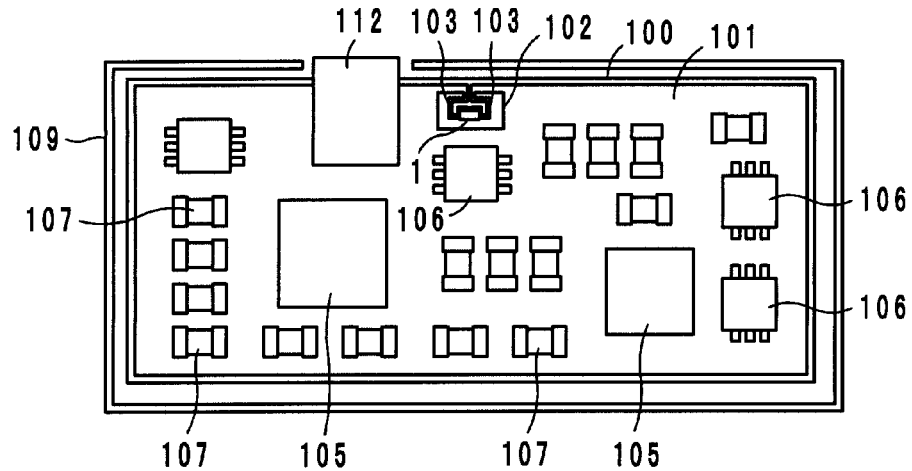
FIG. 26 is a plan view of a radio IC device according to another preferred embodiment of the present invention.

In the radio IC device according to a seventeenth preferred embodiment, a slot case 112 of a USB card is electrically connected to the ground electrode 101 disposed on the printed wiring board 100, as shown in FIG. 26. The other structure is substantially the same as in the fifteenth preferred embodiment. The slot case 112 is a metal component, and is electrically continued to the ground electrode 101 to function as a radiation plate of the electromagnetic coupling module 1.

Eighteenth Preferred Embodiment

Figure 27:
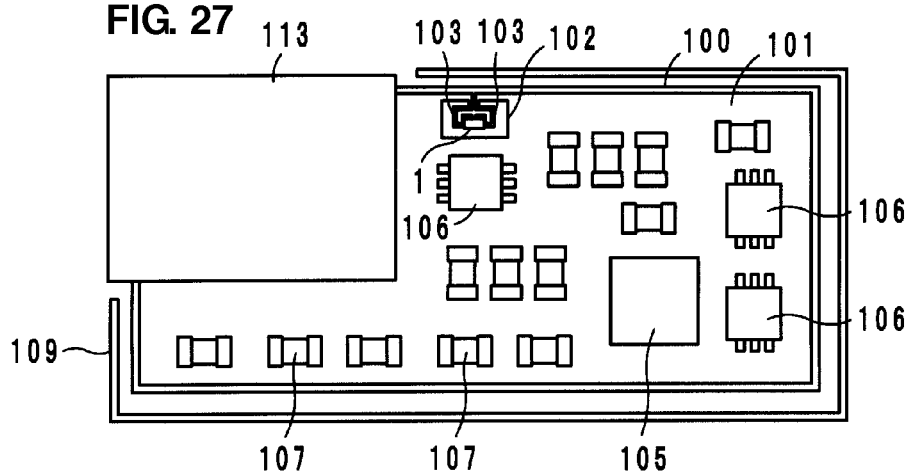
FIG. 27 is a plan view of a radio IC device according to another preferred embodiment of the present invention.

In the radio IC device according to an eighteenth preferred embodiment, the metal case of a battery 113 is electrically connected to the ground electrode 101 disposed on the printed wiring board 100, as shown in FIG. 27. The other structure is substantially the same as in the fifteenth preferred embodiment. The metal case of the battery 113 is electrically connected to the ground electrode 101 to function as the radiation plate of the electromagnetic coupling module 1.

Nineteenth Preferred Embodiment

Figure 28:
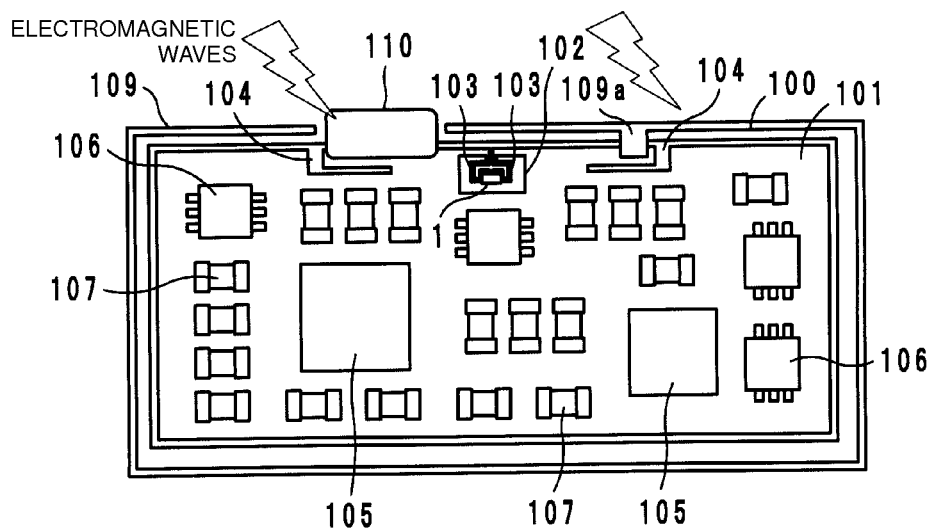
FIG. 28 is a plan view of a radio IC device according to another preferred embodiment of the present invention.

In the radio IC device according to a nineteenth preferred embodiment, the shielding case 109 of the fifteenth preferred embodiment shown in FIG. 23 is electrically connected to the ground electrode 101 through a conductor portion 109a, as shown in FIG. 28. The other structure is substantially the same as in the fifteenth preferred embodiment. In the nineteenth preferred embodiment, the shielding case 109 as well as the metal portion of the connector 110 functions as a radiation plate. The ground electrode 101 includes a slit 104 in the vicinity of the conductor portion 109a, so that electromagnetic waves through the shielding case 109 can efficiently propagate to the loop electrode 103.

Twentieth Preferred Embodiment

Figure 29:
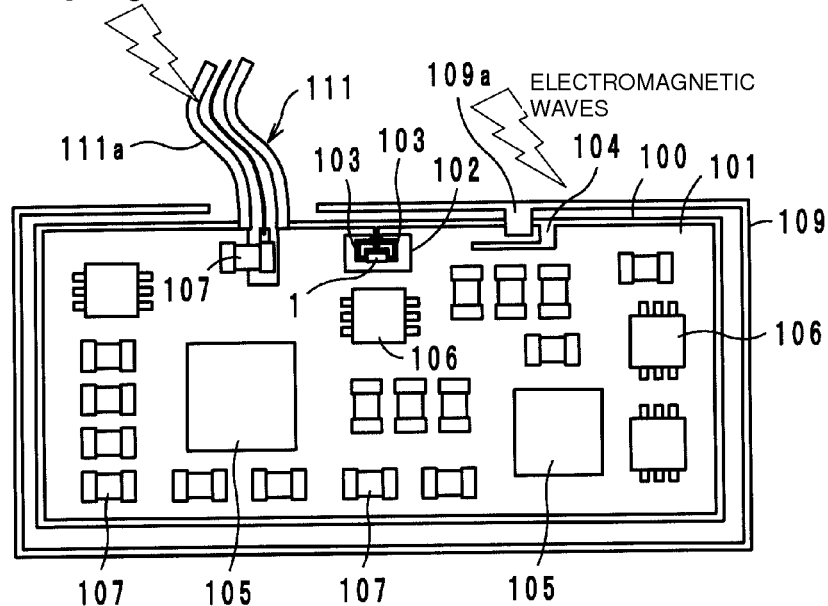
FIG. 29 is a plan view of a radio IC device according to another preferred embodiment of the present invention.

In the radio IC device according to a twentieth preferred embodiment, the shielding case 109 of the sixteenth preferred embodiment shown in FIG. 25 is electrically connected to the ground electrode 101 through a conductor portion 109a, as shown in FIG. 29. The other structure is substantially the same as in the sixteenth preferred embodiment. In the twentieth preferred embodiment, the shielding case 109 as well as the shielding wire 111a of the coaxial cable 111 functions as a radiation plate. The ground electrode 101 includes a slit 104 in the vicinity of the conductor portion 109a, so that electromagnetic waves through the shielding case 109 can efficiently propagate to the loop electrode 103.

Twenty First Preferred Embodiment

Figure 30:
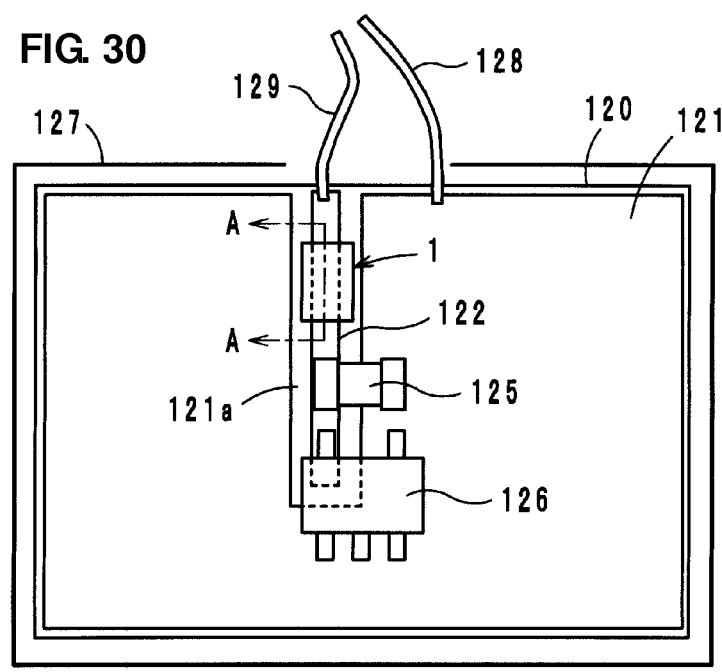
FIG. 30 is a plan view of a radio IC device according to another preferred embodiment of the present invention.

In the radio IC device according to a twenty first preferred embodiment, a ground electrode 121 disposed on a printed wiring board 120 includes a slit opening 121a, as shown in FIG. 30. A wiring electrode (hereinafter referred to as power line 122) is provided in the slit opening 121a. A power supply cable 128 is connected to the ground electrode 121, and another power supply cable 129 is connected to the power line 122. In this state, the electromagnetic coupling module 1 is bonded on the power line 122. The printed wiring board 120 is covered with a shielding case 127 and the power supply cables 128 and 129 extend a relatively long distance out of the shielding case 127. The power line 122 is provided with a capacitor 125 to reject high-frequency noises, a voltage regulator 126 and other interference to stabilize the voltage.

Figure 32:
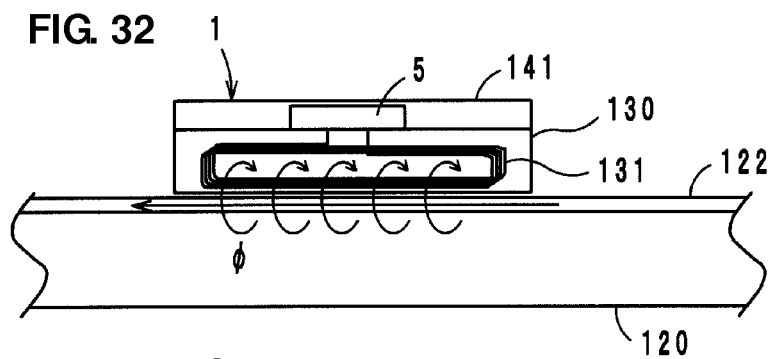
FIG. 32 is a sectional view taken along line A-A in FIG. 30.

The electromagnetic coupling module 1 includes a feed circuit board 130 including a coil (inductance element) 131, a radio IC chip 5 on the feed circuit board 130, and a resin protecting member 141 covering the feed circuit board 130 and the radio IC chip 5, as shown in FIG. 32. The coil 131 is arranged such that the coil axis extends parallel or substantially parallel to the power line 122, and each end of which is electrically connected to the radio IC chip 5.

Figure 31:
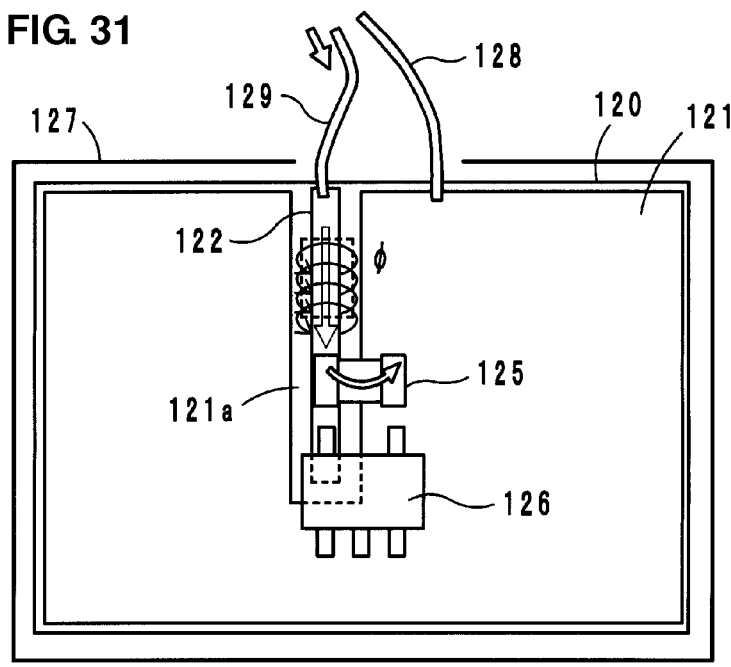
FIG. 31 is a plan view illustrating the operation principle of the radio IC device according to the preferred embodiment shown in FIG. 30.

In the operation principle of the radio IC device of the twenty first preferred embodiment, when the power supply cable 129 receives magnetic waves from a reader/writer (not shown), the power line 122 generates a current, as shown in FIG. 31. The current flows to the ground electrode 121 through the capacitor 125 to generate a magnetic field $\phi$ at the power line 122. The magnetic field $\phi$ is coupled to the coil 131 of the feed circuit board 130, thus operating the radio IC chip 5.

In the twenty first preferred embodiment, the power supply cable 129 functions as a radiation plate. Also, the power line 122 functions as a radiation plate in the course of the manufacturing process in which the shielding case 127 or the power supply cable 129 is not provided. The power supply cable 129 may be directly connected to the reader/writer.

Twenty Second Preferred Embodiment

Figure 33:
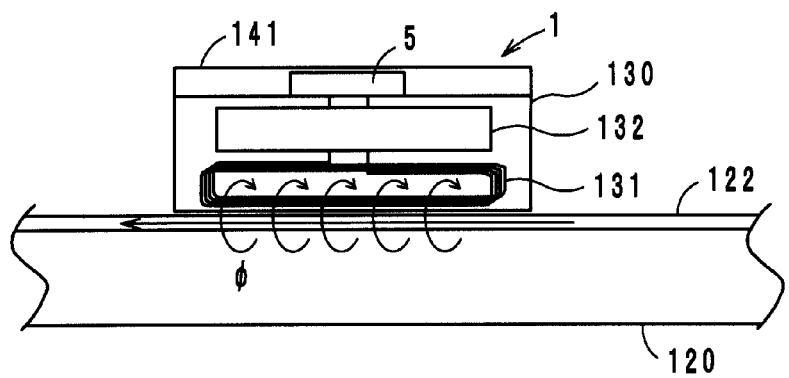
FIG. 33 is a sectional view of a radio IC device according to another preferred embodiment of the present invention.

In the radio IC device according to a twenty second preferred embodiment, the feed circuit board 130 of the electromagnetic coupling module 1 is provided with a matching circuit/resonance circuit 132 in addition to the coil 131, as shown in FIG. 33. The other structure is substantially the same as in the twenty first preferred embodiment. The twenty second preferred embodiment produces substantially the same effects as the twenty first preferred embodiment. In particular, when the circuit 132 is a matching circuit, the matching with the coil 131 can be provided, so that the radio IC chip 5 can be operated even at a low power. When the circuit 132 is a resonance circuit, the radio IC chip can be frequency-selective, and accordingly, the variation in frequency can be reduced. Thus, the radio IC chip can work in a wide range of frequencies.

Twenty Third Preferred Embodiment

Figure 34:
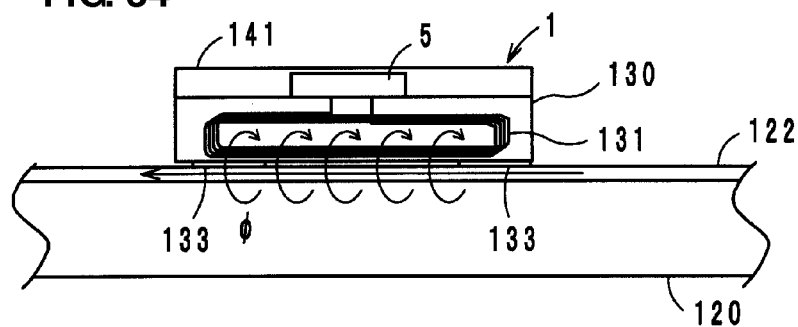
FIG. 34 is a sectional view of a radio IC device according to another preferred embodiment of the present invention.

In the radio IC device according to a twenty third preferred embodiment, the feed circuit board 130 of the electromagnetic coupling module 1 is provided with a pair of external terminal electrodes 133 on the rear surface thereof, as shown in FIG. 34. The other structure is substantially the same as in the twenty first preferred embodiment. The twenty third preferred embodiment produces substantially the same effects as the twenty first preferred embodiment. In particular, the external terminal electrodes 133 provided on the rear surface of the feed circuit board 130 allow the electromagnetic coupling module 1 to be joined to the power line 122 with solder, for example. Thus, the electromagnetic coupling module 1 can be mounted simultaneously with other surface mount components. Alternatively, only a single external terminal electrode 133 may be formed at substantially the center of the rear surface of the feed circuit board 130.

Twenty Fourth Preferred Embodiment

Figure 35:
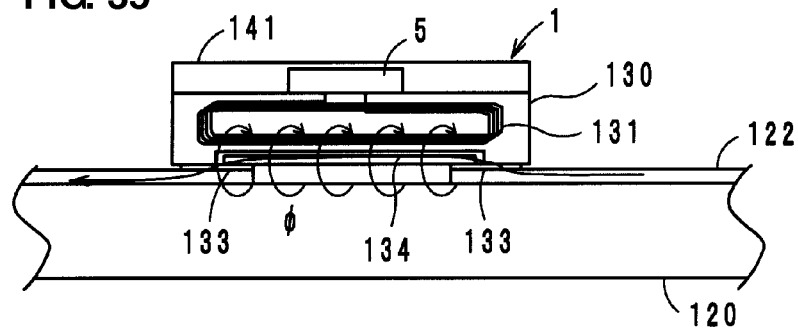
FIG. 35 is a sectional view of a radio IC device according to another preferred embodiment of the present invention.

In the radio IC device according to a twenty fourth preferred embodiment, the feed circuit board 130 of the electromagnetic coupling module 1 is provided with a pair of external terminal electrodes 133 on the rear surface thereof, as shown in FIG. 35. In addition, a conductor 134 is disposed within the feed circuit board 130 on the rear surface side, and the power line 122 is cut under the conductor 134. The other structure is substantially the same as in the twenty first and the twenty third preferred embodiment. The twenty fourth preferred embodiment produces substantially the same effects as the twenty first and the twenty third preferred embodiment. Since the current running in the power line 122 is conducted to flow near the coil 131 by the conductor 134, the degree of coupling is improved, and accordingly, the radio IC chip can operate at a low power. In addition, the variation in coupling degree is reduced.

Twenty Fifth Preferred Embodiment

Figure 36:
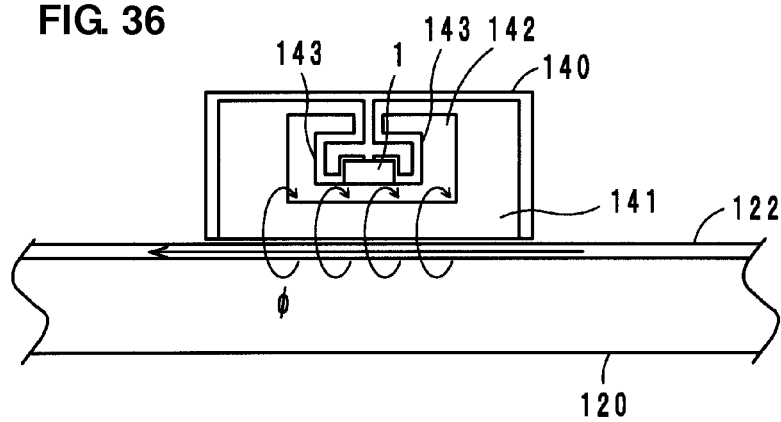
FIG. 36 is an assembly diagram of a radio IC device according to another preferred embodiment of the present invention.

In the radio IC device according to a twenty fifth preferred embodiment, an auxiliary substrate 140 is provided on which an electromagnetic coupling module 1 is mounted, as shown in FIG. 36. A coupling electrode 141 having an opening 142 is provided on the auxiliary substrate 140, and a pair of loop electrodes 143 functioning as inductance elements is provided in the opening 142. The electromagnetic coupling module 1 (or radio IC chip 5 alone) is coupled to the end of each loop electrode 143. The other structure is substantially the same as in the twenty first preferred embodiment.

In the twenty fifth preferred embodiment, the electromagnetic coupling module 1 is coupled to the loop electrodes 143, and in addition, the coupling electrode 141 is coupled to the power line 122. Substantially the same effects are produced as in the twenty first preferred embodiment. In particular, the use of the auxiliary substrate 140 enables the use of a large coupling electrode 141 or the increase of the coil 131 in the feed circuit board 130. Thus, the degree of coupling to the power line 122 can be increased. In addition, the coupling electrode 141 on the auxiliary substrate 140 can function as the radiation plate by itself, and can be disposed anywhere on the printed wiring board 120.

Twenty Sixth Preferred Embodiment

Figure 37:
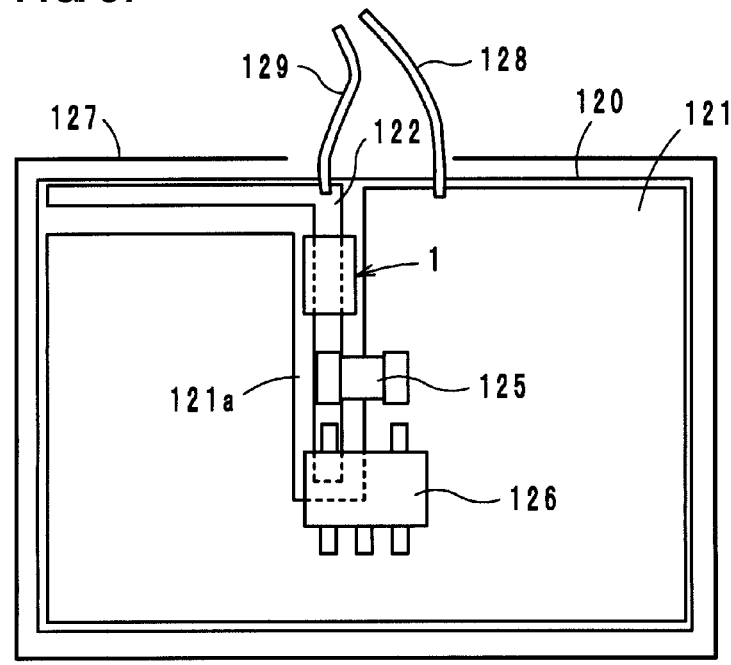
FIG. 37 is a plan view of a radio IC device according to another preferred embodiment of the present invention.

In the radio IC device according to a twenty sixth preferred embodiment, a power line 122 on which the electromagnetic coupling module 1 is mounted is arranged so as to extend a relatively long distance in the lateral direction along an edge of the printed wiring board 120, as shown in FIG. 37. The other structure is substantially the same as in the twenty first preferred embodiment (see FIG. 30). The twenty sixth preferred embodiment produces substantially the same effects as the twenty first preferred embodiment. The lengthened power line 122 functions as the radiation plate and allows the radio IC device to function before the shielding case 127 or the power supply cable 129 is provided.

Twenty Seventh Preferred Embodiment

Figure 38:
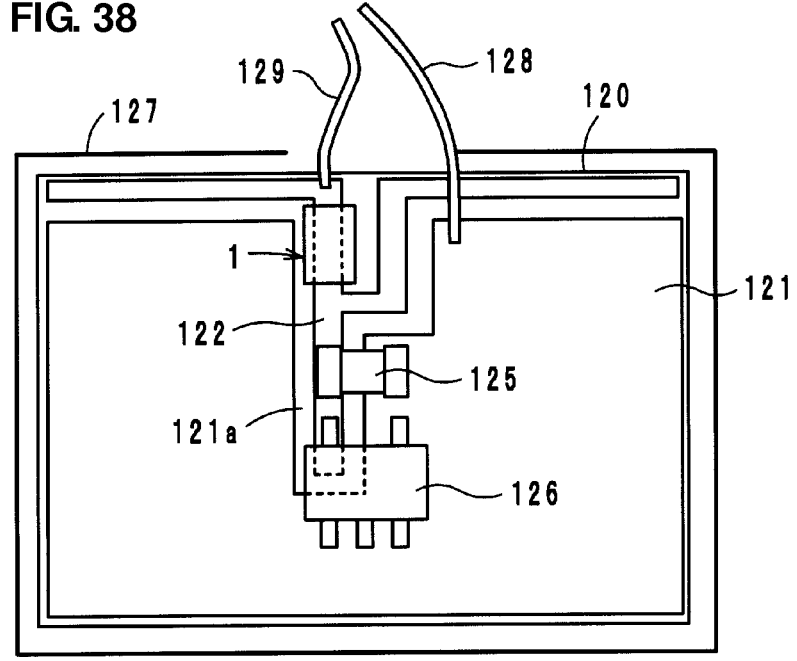
FIG. 38 is a plan view of a radio IC device according to another preferred embodiment of the present invention.

In the radio IC device according to a twenty seventh preferred embodiment, the power line 122 shown in FIG. 37 is branched so as to extend a relatively long distance in the lateral direction along an edge of the printed wiring board 120, as shown in FIG. 38. The other structure is substantially the same as in the twenty first and the twenty sixth preferred embodiment. Since the power line 122 functioning as a radiation plate of the twenty seventh preferred embodiment is longer than that of the twenty sixth preferred embodiment, electromagnetic waves can be more efficiently transmitted and received, and the operation can be performed at a low power. Preferably, the power line 122 has a length that enables it to resonate.

Twenty Eighth Preferred Embodiment

Figure 39:
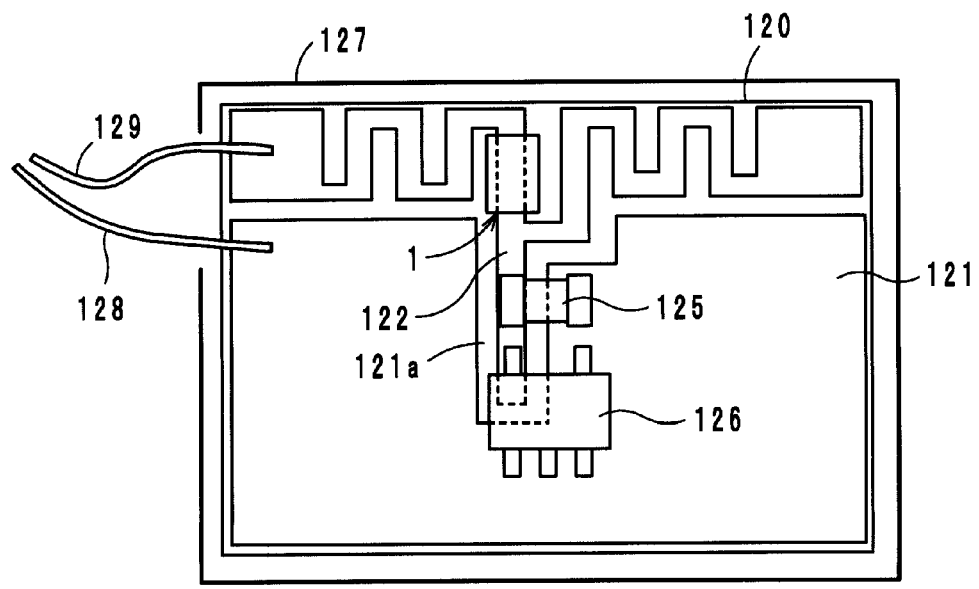
FIG. 39 is a plan view of a radio IC device according to another preferred embodiment of the present invention.

In the radio IC device according to a twenty eighth preferred embodiment, the extensions of the power line 122 shown in FIG. 38 are configured in a meandering arrangement, as shown in FIG. 39. The other structure is substantially the same as in the twenty first preferred embodiment. In the twenty eighth preferred embodiment, the power line 122 functioning as a radiation plate is relatively large, and accordingly, electromagnetic waves can be transmitted and received more efficiently.

Twenty Ninth Preferred Embodiment

Figure 40:
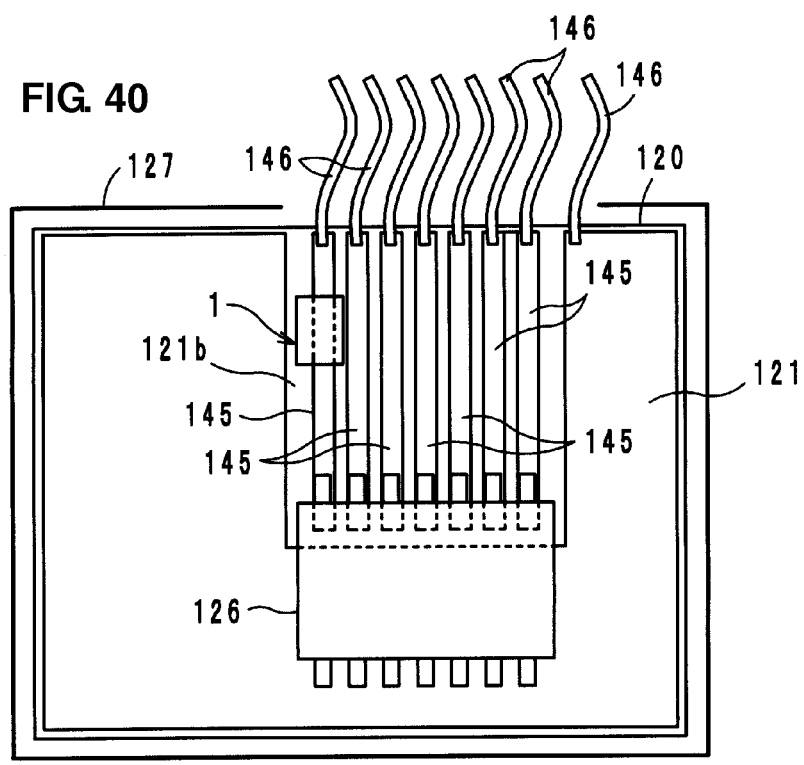
FIG. 40 is a plan view of a radio IC device according to another preferred embodiment of the present invention.

In the radio IC device according to a twenty ninth preferred embodiment, the ground electrode 121 disposed on the printed wiring board 120 has a relatively large opening 121b in which a plurality of line electrodes 145 are arranged in parallel or substantially in parallel with each other. The line electrodes 145 are connected to signal lines 146, such as for a USB, and one of which is coupled to the electromagnetic coupling module 1, as shown in FIG. 40. A regulator 126 is disposed between the line electrodes 145 and the ground electrode 121.

In the twenty ninth preferred embodiment, the signal lines 146 functions as a radiation plate, and substantially the same effects are produced as in the twenty first preferred embodiment and other preferred embodiments. In particular, the radio IC device can function even though it is driven by a battery and does not have a power supply cable.

Thirtieth Preferred Embodiment

Figure 41:
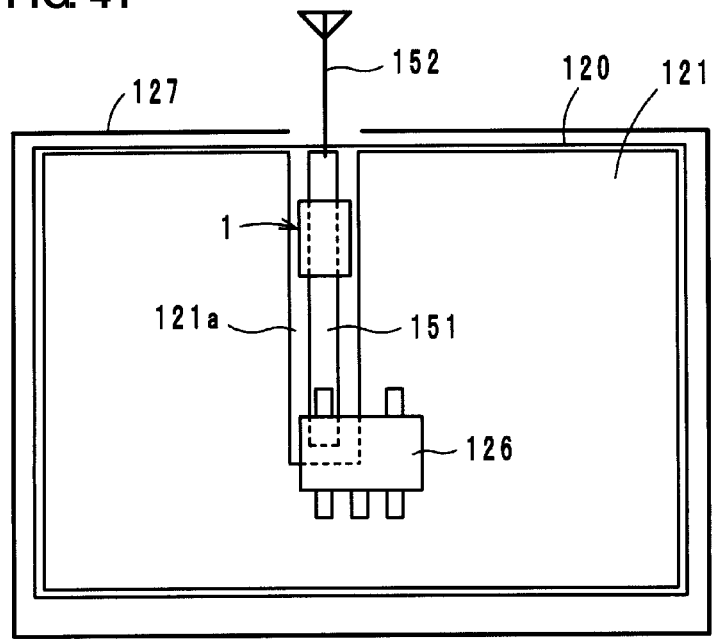
FIG. 41 is a plan view of a radio IC device according to another preferred embodiment of the present invention.

In the radio IC device according to a thirtieth preferred embodiment, the electrode 121 disposed on the printed wiring board 120 includes a slit opening 121a, as shown in FIG. 41. An antenna line 151 is disposed in the slit opening 121a, and an antenna wire 152 is connected to the antenna line 151. The electromagnetic coupling module 1 is coupled to the antenna line 151. The regulator 126 is disposed between the antenna line 151 and the ground electrode 121.

In the thirtieth preferred embodiment, the antenna wire 152 functions as a radiation plate, and substantially the same effects are produced as in the twenty first preferred embodiment and other preferred embodiments. The electromagnetic coupling module 1 is provided with a resonance circuit or a matching circuit so that energy is transmitted to the radio IC chip 5 only at a frequency at which the IC chip 5 operates as an RFID, thus preventing interference with the operation of the antenna. In the present preferred embodiment, the antenna wire 152 intended to receive electromagnetic waves is efficiently used as a radiation plate. Accordingly, the operation can be performed at a low power.

Thirty First Preferred Embodiment

Figure 42:
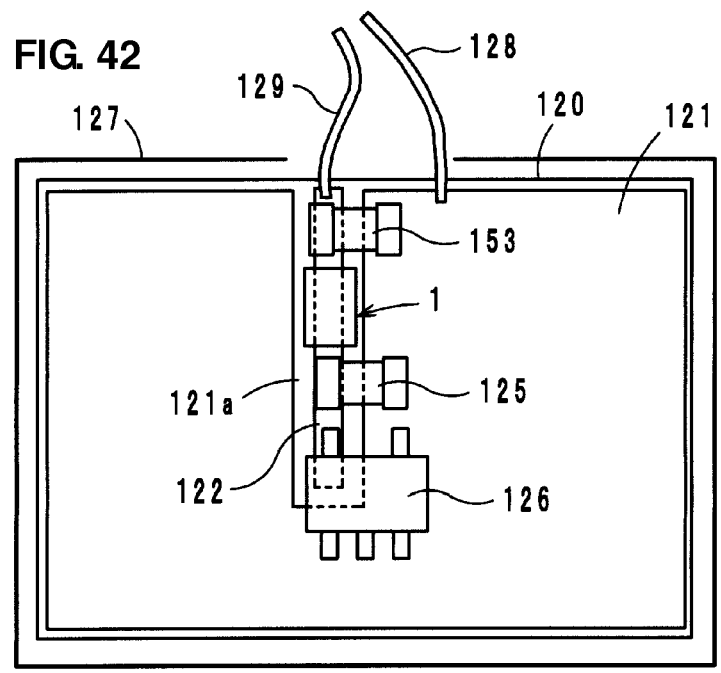
FIG. 42 is a plan view of a radio IC device according to another preferred embodiment of the present invention.

In the radio IC device according to a thirty first preferred embodiment, an anti-ESD device, such as a varistor 153, for example, is disposed between the power line 122 and the ground electrode 121, and the electromagnetic coupling module 1 is disposed downstream from the varistor 153, as shown in FIG. 42. The other structure is substantially the same as in the twenty first preferred embodiment (see FIG. 30). The thirty first preferred embodiment produces substantially the same effects as the twenty first preferred embodiment. In particular, the presence of the varistor 153 improves the electrostatic surge resistance.

Thirty Second Preferred Embodiment

Figure 43:
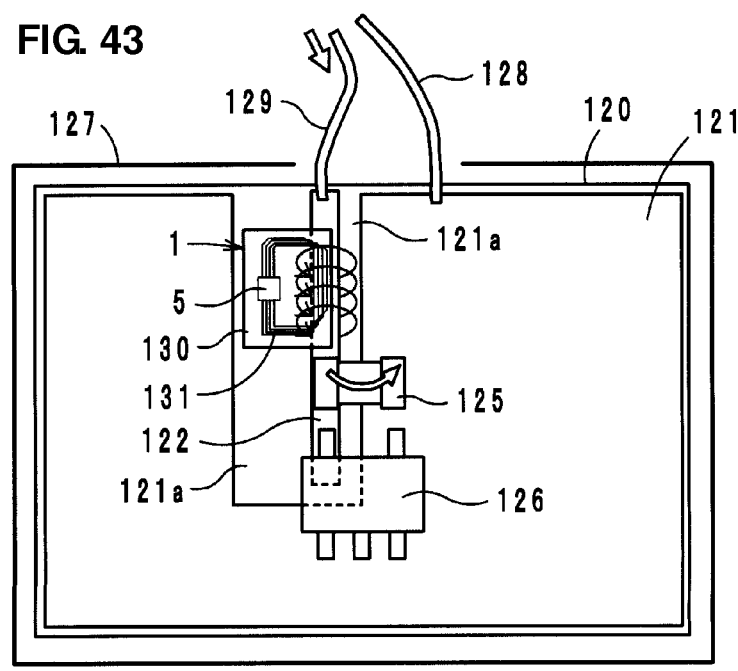
FIG. 43 is a plan view of a radio IC device according to another preferred embodiment of the present invention.

The radio IC device according to a thirty second preferred embodiment is substantially the same as that of the twenty first preferred embodiment (see FIG. 30) in that the electromagnetic coupling module 1 is coupled to the power line 122, as shown in FIG. 43. The two preferred embodiments have a difference in that the coil 131 provided on the feed circuit board 130 is disposed such that the coil axis extends in the direction perpendicular or substantially perpendicular to the power line 122. The thirty second preferred embodiment produces substantially the same effects as the twenty first preferred embodiment. In particular, the coil 131 is arranged such that the coil axis extends in the direction in which the sheets of the feed circuit board 130 are stacked, and this facilitates the formation of the coil 131.

Thirty Third Preferred Embodiment

Figure 44:
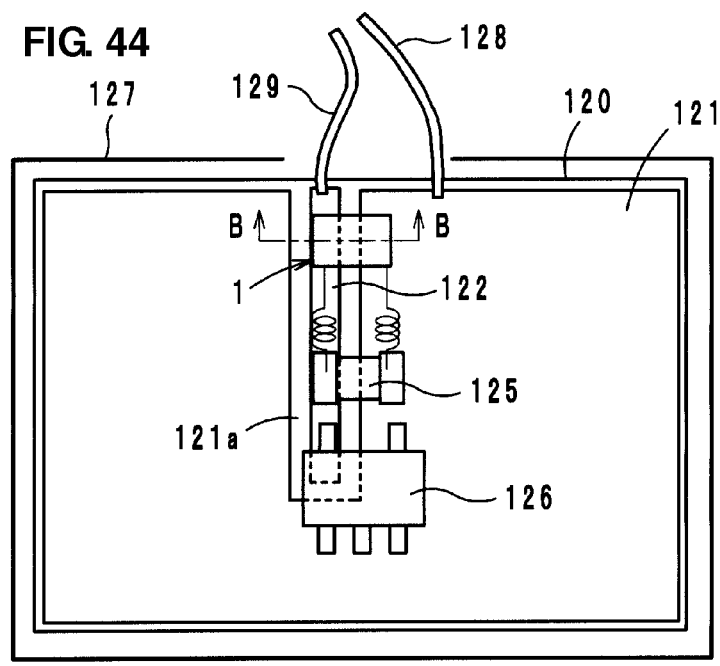
FIG. 44 is a plan view of a radio IC device according to another preferred embodiment of the present invention.

In the radio IC device according to a thirty third preferred embodiment, the ground electrode 121 disposed on the printed wiring board 120 includes a slit opening 121a, as shown in FIG. 44. A power line 122 is disposed in the slit opening 121a. A power supply cable 128 is connected to the ground electrode 121, and another power supply cable 129 is connected to the power line 122. In this state, an electromagnetic coupling module 1 is bonded across the region between the power line 122 and the ground electrode 121. The printed wiring board 120 is covered with a shielding case 127 and the power supply cables 128 and 129 extend long out of the shielding case 127. The power line 122 is provided with a capacitor 125 for rejecting high-frequency noises, a voltage regulator 126 and the like to stabilize the voltage.

Figure 45:
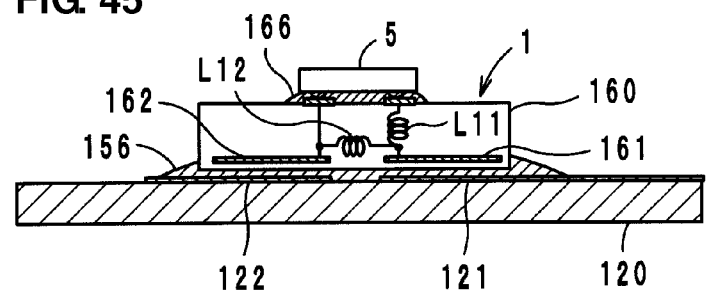
FIG. 45 is a sectional view taken along line B-B in FIG. 44.

The electromagnetic coupling module 1 includes the radio IC chip 5 and a feed circuit board 160, as shown in FIG. 45. The feed circuit board 160 includes inductance elements L11 and L12 magnetically coupled to each other, and a resonance circuit having a predetermined resonance frequency with capacitors defined by an internal electrode 161 and a ground electrode 121 and by an internal electrode 162 and a power line 122. The radio IC chip 5 is electrically connected to the resonance circuit with solder bumps. In FIG. 45, reference numeral 156 designates an adhesive, and reference numeral 166 designates a protective layer for the solder bumps.

In the operation principle of the radio IC device of the thirty third preferred embodiment, when the power supply cable 129 receives magnetic waves from a reader/writer (not shown), the power line 122 generates a current. In this instance, the power line 122 and the ground electrode 121 have a potential difference therebetween, because of the presence of an inductance component (in a coil form) as shown in FIG. 44 in view of high frequency. The occurrence of the potential difference enables the internal electrodes 161 and 162 of the feed circuit board 160 to be electromagnetically coupled to the ground electrode 121 and the power line 122, so that a signal operates the radio IC chip 5 through the resonance circuit.

In the thirty third preferred embodiment, the power supply cable 129 functions as a radiation plate, and substantially the same effects are produced as in the twenty first preferred embodiment (see FIG. 30). Since the feed circuit board 160 includes the resonance circuit including the inductance elements L11 and L12 and the capacitor, the feed circuit board functions of matching with the radio IC chip 5 and a function of selecting frequency. Thus, signals can be transmitted in a wide range of frequencies. The electromagnetic coupling module 1 may be replaced with only a radio IC chip 5.

Thirty Fourth Preferred Embodiment

Figure 46:
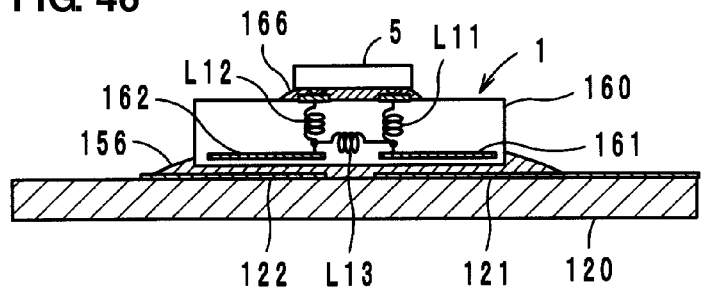
FIG. 46 is a sectional view of a radio IC device according to another preferred embodiment of the present invention.

In the radio IC device according to thirty fourth preferred embodiment, the resonance circuit provided in the feed circuit board 160 of the electromagnetic coupling module 1 is defined by inductance elements L11, L12 and L13 coupled to each other, as shown in FIG. 46. In the thirty fourth preferred embodiment, the other structure is substantially the same as in the thirty third preferred embodiment, and substantially the same effects are produced as in the thirty third preferred embodiment. In particular, since the resonance circuit is bilaterally symmetrical, the electromagnetic coupling module 1 can be mounted without considering the directivity.

Thirty Fifth Preferred Embodiment

Figure 47:
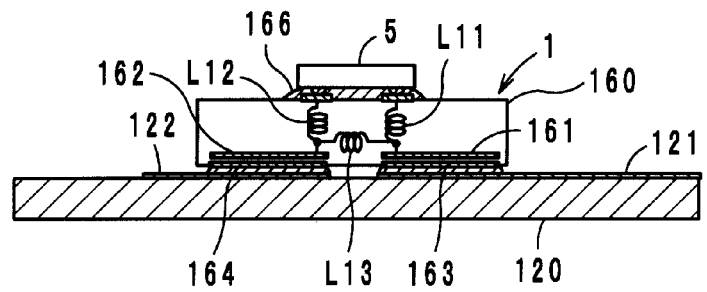
FIG. 47 is a sectional view of a radio IC device according to another preferred embodiment of the present invention.

In the radio IC device according to a thirty fifth preferred embodiment, external terminal electrodes 163 and 164 that oppose the internal electrodes 161 and 162 are provided on the rear surface of the feed circuit board 160, as shown in FIG. 47. In the thirty fifth preferred embodiment, the other structure is substantially the same as in the thirty fourth preferred embodiment, and substantially the same effects are produced as in the thirty fourth preferred embodiment. By providing the external terminal electrodes 163 and 164, the electromagnetic coupling module 1 can be bonded on the printed wiring board 120 with solder, for example, and thus, can be mounted simultaneously with other surface mount components.

Thirty Sixth Preferred Embodiment

Figure 48:
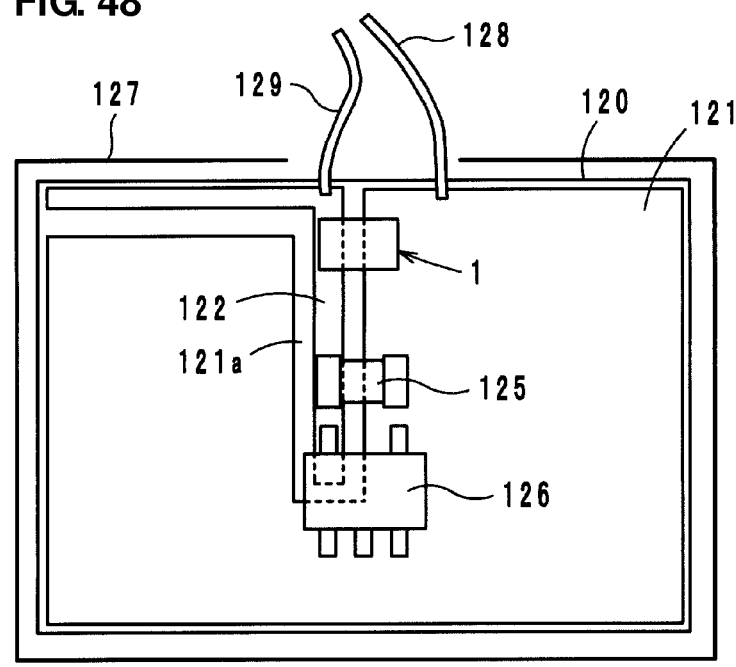
FIG. 48 is a plan view of a radio IC device according to another preferred embodiment of the present invention.

In the radio IC device according to a thirty sixth preferred embodiment, a power line 122 on which the electromagnetic coupling module 1 is mounted is provided so as to extend a relatively long distance in the lateral direction along an edge of the printed wiring board 120, as shown in FIG. 48. The other structure is substantially the same as in the thirty third preferred embodiment (see FIG. 44). The thirty sixth preferred embodiment produces substantially the same effects as the thirty third preferred embodiment. The lengthened power line 122 can more effectively function as the radiation plate and enables the radio IC device to function before the shielding case 127 or the power supply cable 129 is provided.

Thirty Seventh Preferred Embodiment

Figure 49:
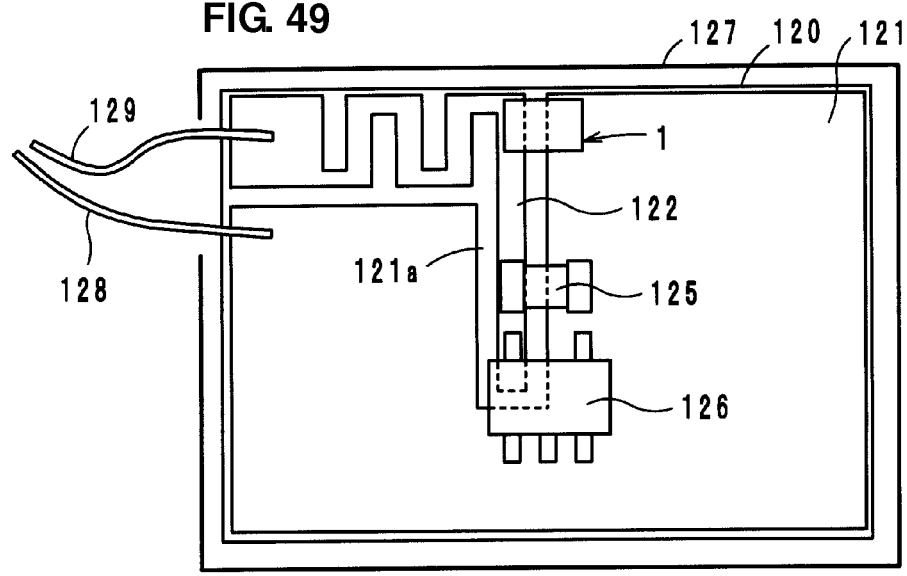
FIG. 49 is a plan view of a radio IC device according to another preferred embodiment of the present invention.

The radio IC device according to a thirty seventh preferred embodiment, the extension of the power line 122 shown in FIG. 48 is configured in a meandering arrangement, as shown in FIG. 49. The other structure is substantially the same as in the thirty third preferred embodiment. In the thirty seventh preferred embodiment, the power line 122 functioning as a radiation plate is relatively large, and accordingly, electromagnetic waves can be transmitted and received more efficiently.

Thirty Eighth Preferred Embodiment

Figure 50:
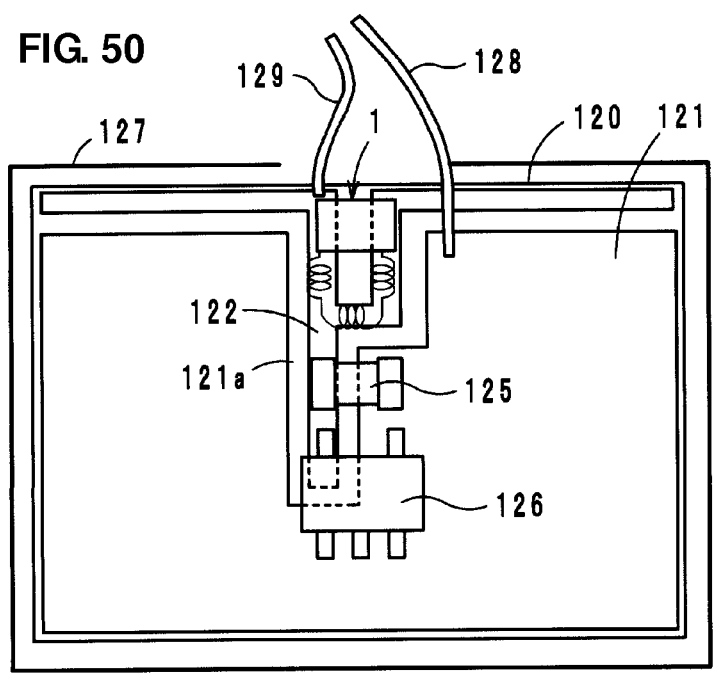
FIG. 50 is a plan view of a radio IC device according to another preferred embodiment of the present invention.

In the radio IC device according to a thirty eighth preferred embodiment, the power line 122 shown in FIG. 48 is branched so as to extend a relatively long distance in the lateral direction along an edge of the printed wiring board 120, as shown in FIG. 50. The other structure is substantially the same as in the thirty third and the thirty sixth preferred embodiment. Since the power line 122 functioning as a radiation plate of the thirty eighth preferred embodiment is longer than that of the thirty sixth preferred embodiment, electromagnetic waves can be more efficiently transmitted and received, and the operation can be performed at a low power. Preferably, the power line 122 has a length which enables it to resonate.

Thirty Ninth Preferred Embodiment

Figure 51:
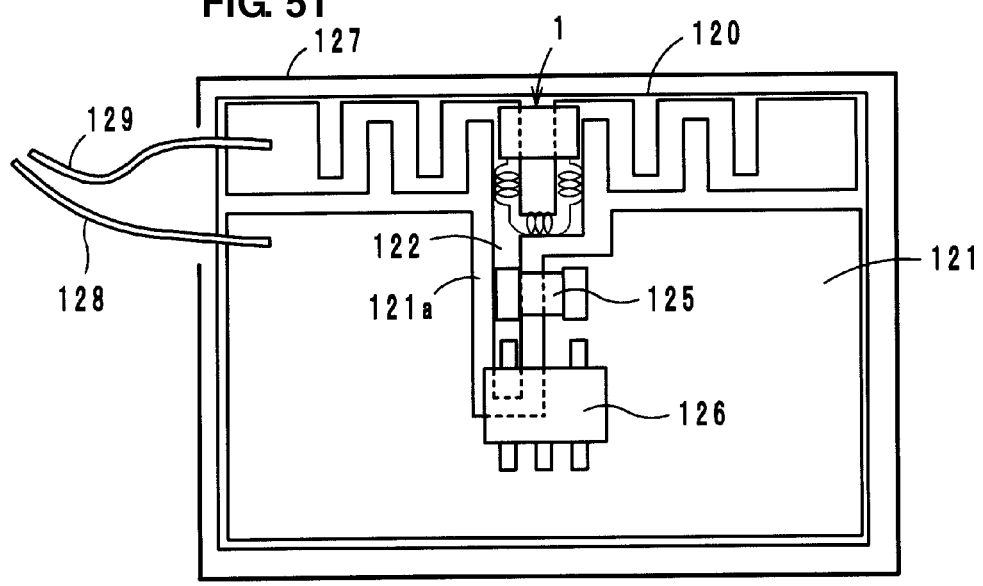
FIG. 51 is a plan view of a radio IC device according to another preferred embodiment of the present invention.

In the radio IC device according to a thirty ninth preferred embodiment, the extensions to both sides of the power line 122 are configured in a meandering arrangement, as shown in FIG. 51. The other structure is substantially the same as in the thirty third preferred embodiment. In the thirty ninth preferred embodiment, the power line 122 functioning as a radiation plate is relatively large, and accordingly, electromagnetic waves can be transmitted and received more efficiently.

Fortieth Preferred Embodiment

In the radio IC device according to a fortieth preferred embodiment, a portion of the power line 122 is disposed under the printed wiring board 120, as shown in FIG. 52, and the electromagnetic coupling module 1 is mounted across the region between the power line 122 exposed at the surface and the ground electrode 121. The power supply cable 129 is connected to an end 122a of the power line exposed at the surface.

In the fortieth preferred embodiment, the other structure is substantially the same as in the thirty third preferred embodiment, and substantially the same effects are produced as in the thirty third preferred embodiment. In particular, since the power line 122 is partially disposed under the printed wiring board 120, the flexibility of wiring on the surface is improved.

Forty First Preferred Embodiment

In the radio IC device according to a forty first preferred embodiment, the power line 122 is bent in a substantial C shape and both ends of the electromagnetic coupling module 1 are connected to the bent portions, as shown in FIG. 53. In the forty first preferred embodiment, the other structure is substantially the same as in the thirty third preferred embodiment, and substantially the same effects are produced as in the thirty third preferred embodiment.

Forty Second Preferred Embodiment

Figure 54:
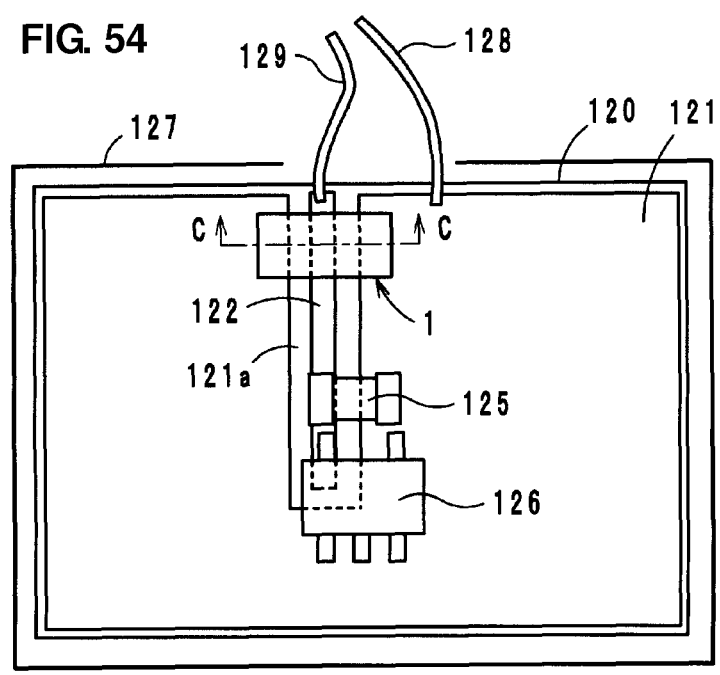
FIG. 54 is a plan view of a radio IC device according to another preferred embodiment of the present invention.

In the radio IC device according to a forty second preferred embodiment, the electromagnetic coupling module 1 is mounted across the power line 122 from one end of the ground electrode 121 to the opposing end, as shown in FIG. 54. The other structure is substantially the same as in the thirty third preferred embodiment, and the electromagnetic coupling module 1 is operated by a difference in potential produced on the ground electrode 121.

Figure 55:
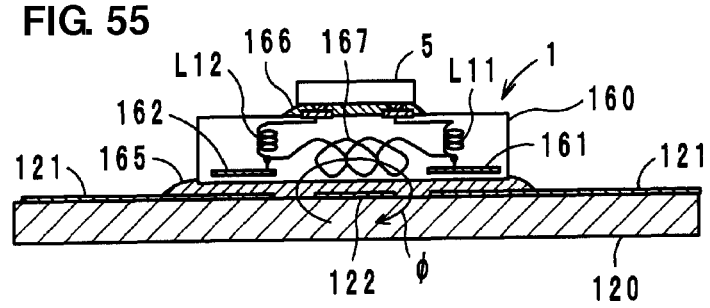
FIG. 55 is a sectional view taken along line C-C in FIG. 54.

In the forty second preferred embodiment, the feed circuit board 160 includes a coil 167 coupled by a magnetic field $\phi$ generated by the current flowing in the power line 122 in addition to the inductance elements L11 and L12, as shown in FIG. 55. The coil 167 is connected in series with the inductance elements L11 and L12, and is thus operated by the current flowing in the power line 122. In other words, the coil 167 functions as a matching inductance element. Even if the power line cannot sufficiently receive magnetic waves, the ground electrode 121 can function as a radiation plate, and even if either element of the feed circuit is broken, the other element ensures the operation.

Forty Third Preferred Embodiment

Figure 56:
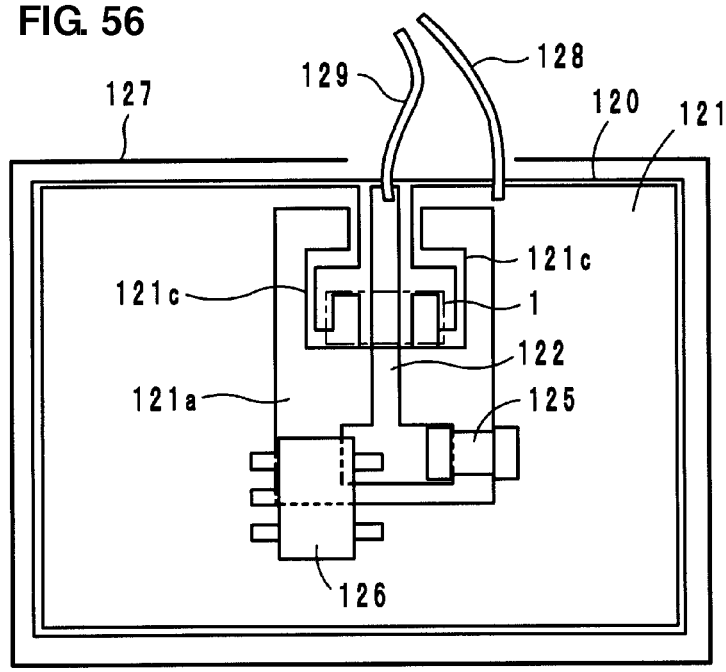
FIG. 56 is a plan view of a radio IC device according to another preferred embodiment of the present invention.

In the radio IC device according to a forty third preferred embodiment, a portion 121c of the ground electrode 121 coupled to the feed circuit of the electromagnetic coupling module 1 is formed in a loop, as shown in FIG. 56. The other structure is substantially the same as in the thirty third and the forty second preferred embodiment, and substantially the same effects are produced as in the thirty third and the forty second preferred embodiments. By forming the portion 121c of the ground electrode 121 coupled to the resonance circuit in a loop, the antenna gain is improved, and the radio IC chip 5 can be operated at a low power.

Forty Fourth Preferred Embodiment

Figure 57:
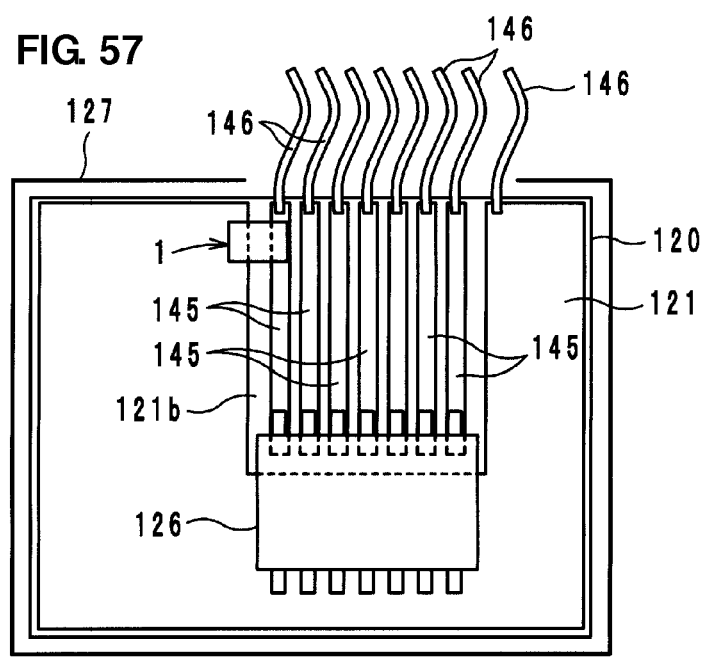
FIG. 57 is a plan view of a radio IC device according to another preferred embodiment of the present invention.

In the radio IC device according to a forty fourth preferred embodiment, the ground electrode 121 disposed on the printed wiring board 120 has a relatively large opening 121b in which a plurality of line electrodes 145 are provided in parallel with each other. The line electrodes 145 are connected to signal lines 146, such as for a USB, and the electromagnetic coupling module 1 is disposed across the region between the ground electrode 121 and one of the line electrodes 145 to be coupled to that one line electrode, as shown in FIG. 57. A regulator 126 is disposed between the line electrodes 145 and the ground electrode 121.

In the forty fourth preferred embodiment, the signal lines 146 function as a radiation plate using the difference in potential between the line electrode 145 and the ground electrode 121, and substantially the same effects are produced as in the thirty third and the twenty ninth preferred embodiment.

Forty Fifth Preferred Embodiment

Figure 58:
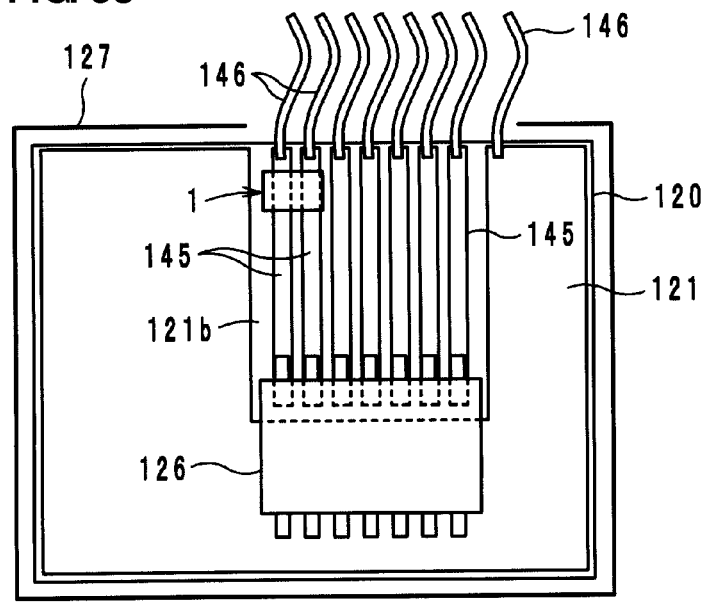
FIG. 58 is a plan view of a radio IC device according to another preferred embodiment of the present invention.

In the radio IC device according to a forty fifth preferred embodiment, the electromagnetic coupling module 1 is coupled so as to be disposed across the region between two adjacent line electrodes 145, as shown in FIG. 58. The other structure is substantially the same as in the forty fourth preferred embodiment and substantially the same effects are produced as in the forty fourth preferred embodiment. The forty fifth preferred embodiment uses the difference in potential between the two adjacent line electrodes 145.

Forty Sixth Preferred Embodiment

Figure 59:
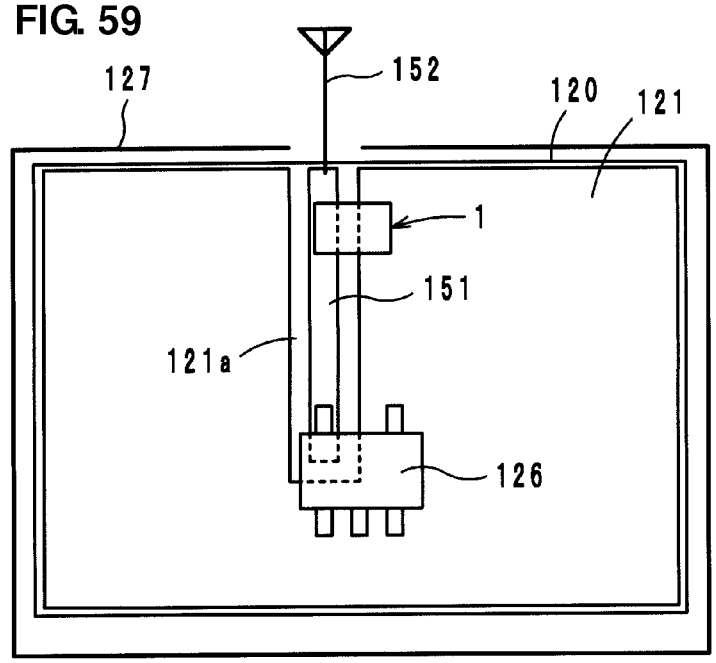
FIG. 59 is a plan view of a radio IC device according to another preferred embodiment of the present invention.

In the radio IC device according to a forty sixth preferred embodiment, the ground electrode 121 disposed on the printed wiring board 120 includes a slit opening 121a, as shown in FIG. 59. An antenna line 151 is disposed in the slit opening 121a, and an antenna wire 152 is connected to the antenna line 151. The electromagnetic coupling module 1 is coupled so as to be disposed across a region between the antenna line 151 and the ground electrode 121. The regulator 126 is disposed between the antenna line 151 and the ground electrode 121. In the forty sixth preferred embodiment, the antenna wire 152 functions as the radiation plate, and substantially the same effects are produced as in the thirty third and the thirtieth preferred embodiment.

Forty Seventh Preferred Embodiment

Figure 60:
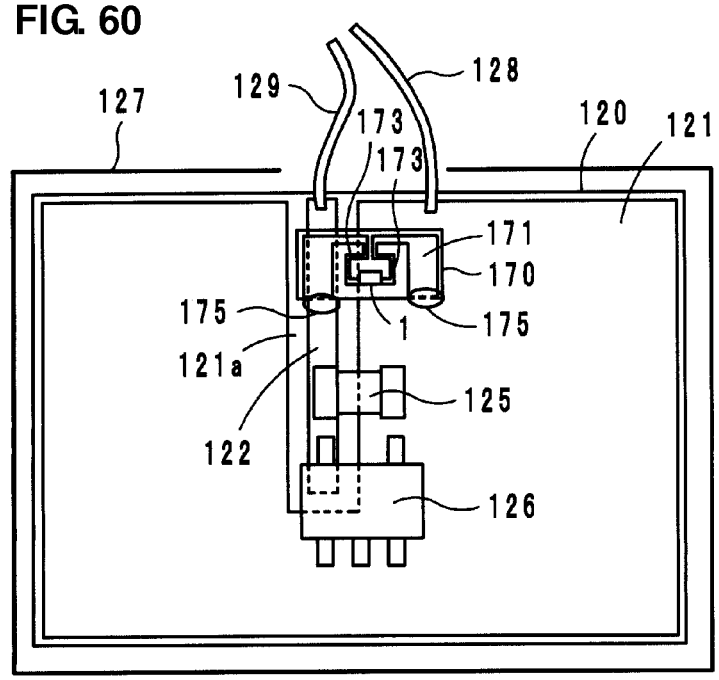
FIG. 60 is a plan view of a radio IC device according to another preferred embodiment of the present invention.

In the radio IC device according to a forty seventh preferred embodiment, an auxiliary substrate 170 is provided on which the electromagnetic coupling module 1 is mounted, as shown in FIG. 60. A coupling electrode 171 is provided on the auxiliary substrate 170, and a pair of loop electrodes 173 functioning as inductance elements is provided for the coupling electrode 171. The electromagnetic coupling module 1 (or radio IC chip 5 alone) is coupled to each end of the loop electrodes 173. The ends of the coupling electrode 171 are connected to the power line 122 and the ground electrode 121 with solder 175. The other structure is substantially the same as in the thirty third preferred embodiment.

In the forty seventh preferred embodiment, the electromagnetic coupling module 1 is coupled to the loop electrodes 173, and in addition, the coupling electrode 171 is disposed across the region between the power line 122 and the ground electrode 121 so as to be coupled to the power line 122 and the ground electrode 121. Thus, substantially the same effects are produced as in the thirty third preferred embodiment. In particular, the use of the auxiliary substrate 170 enables even a small electromagnetic coupling module 1 to be disposed across the region between the power line 122 and the ground electrode 121. In addition, an inductance element or other suitable element may be provided on the auxiliary substrate 170 in order to reduce the size of the feed circuit board 160. Furthermore, the coupling electrode 171 on the auxiliary substrate 170 functions as a radiation plate by itself.

Forty Eighth Preferred Embodiment

Figure 61:
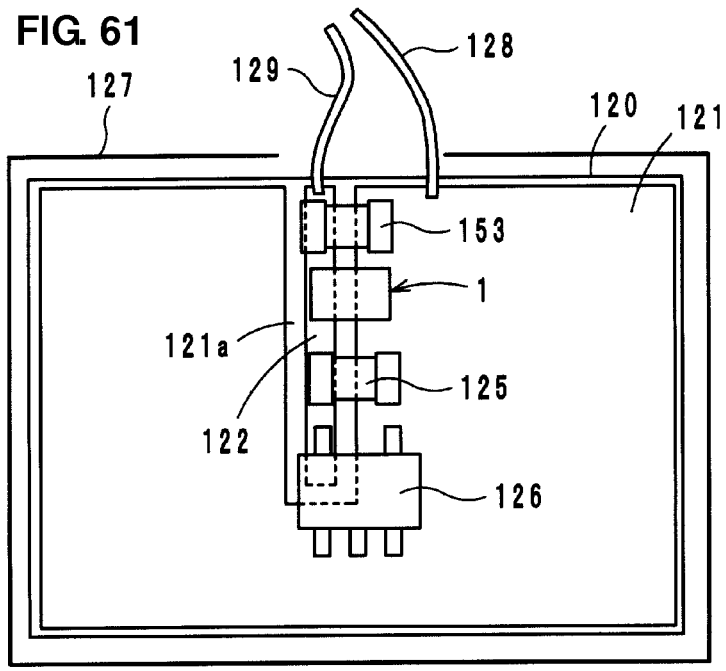
FIG. 61 is a plan view of a radio IC device according to another preferred embodiment of the present invention.

In the radio IC device according to a forty eighth preferred embodiment, an anti-ESD device, such as a varistor 153, for example, is disposed between the power line 122 and the ground electrode 121, and an electromagnetic coupling module 1 is disposed downstream from the varistor 153, as shown in FIG. 61. The other structure is substantially the same as in the thirty third preferred embodiment (see FIG. 44). The forty eighth preferred embodiment produces substantially the same effects as the thirty third and the thirty first preferred embodiment.

Forty Ninth Preferred Embodiment

Figure 62:
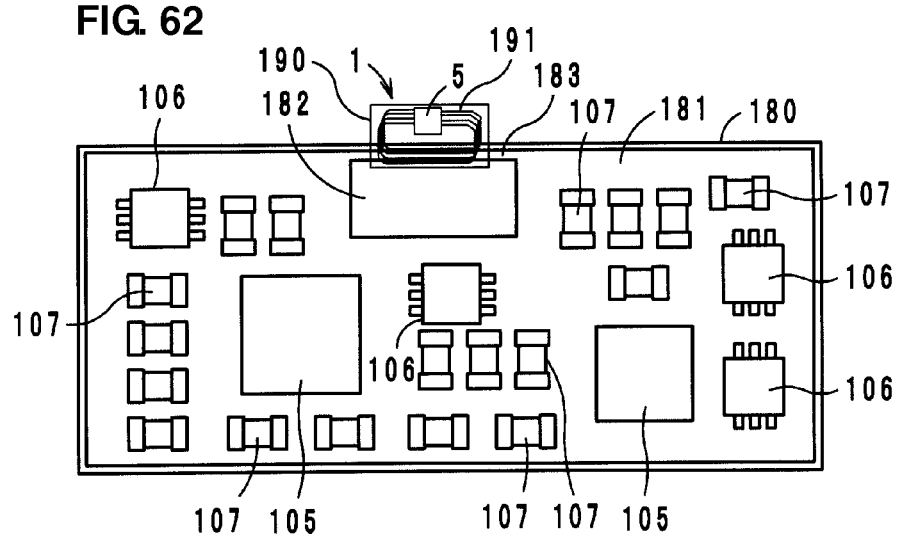
FIG. 62 is a plan view of a radio IC device according to another preferred embodiment of the present invention.
Figure 63:
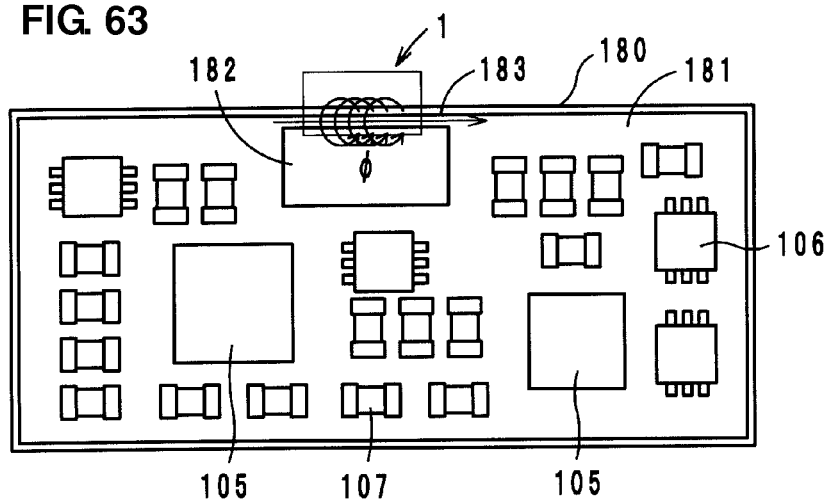
FIG. 63 is a plan view illustrating the operation principle of the radio IC device according to the preferred embodiment shown in FIG. 62.
Figure 64:
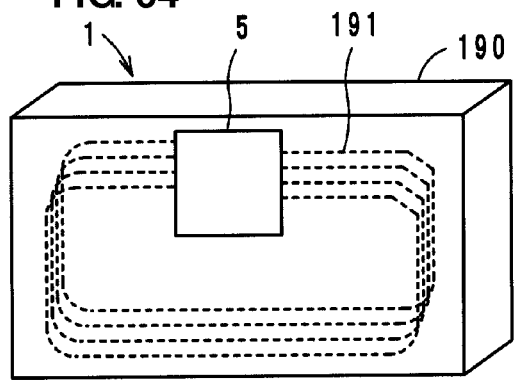
FIG. 64 is a perspective view of an electromagnetic coupling module of the radio IC device according to the preferred embodiment shown in FIG. 62.

In the radio IC device according to a forty ninth preferred embodiment, a ground electrode 181 disposed on a printed wiring board 180 includes an opening 182 to define a loop electrode 183, and the electromagnetic coupling module 1 is mounted on the loop electrode 183, as shown in FIG. 62. The electromagnetic coupling module 1 includes the radio IC chip 5 and a feed circuit board 190. The feed circuit board 190 includes a coil (inductance element) 191, as shown in FIG. 64. The coil 191 is arranged such that the coil axis extends parallel or substantially parallel to the loop electrode 183, and each end of the coil 191 is electrically connected to the radio IC chip 5.

Figure 65:
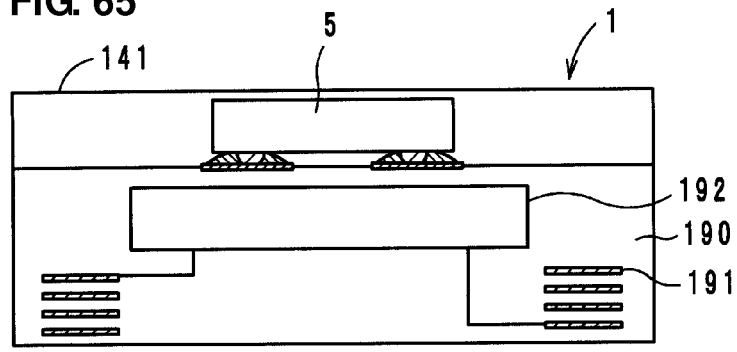
FIG. 65 is a sectional view of the electromagnetic coupling module shown in FIG. 62.

In the operation principle of the radio IC device of the forty ninth preferred embodiment, when the ground electrode 181 receives magnetic waves from a reader/writer (not shown), the loop electrode 183 generates a current. The magnetic field $\phi$ generated by the current is coupled to the coil 191 of the feed circuit board 190, thus operating the radio IC chip 5. In this instance, preferably, the electromagnetic coupling module 1 is arranged such that a magnetic field $\phi$ intersects only one side of the coil 191. In addition to the coil 191, a matching circuit/resonance circuit 192 may be provided within the feed circuit board 190, as shown on FIG. 65.

The elements 105, 106 and 107 disposed on the printed wiring board 180 are substantially the same as in the fifteenth preferred embodiment (see FIG. 23).

Fiftieth Preferred Embodiment

Figure 66:
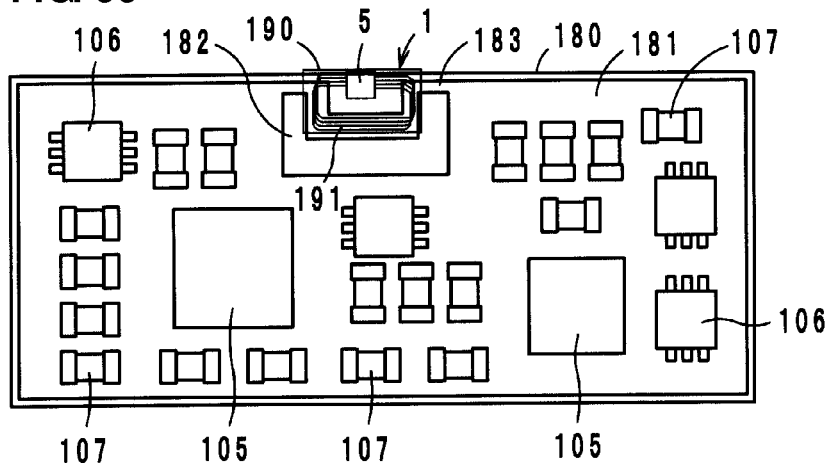
FIG. 66 is a plan view of a radio IC device according to another preferred embodiment of the present invention.

In the radio IC device according to a fiftieth preferred embodiment, the loop electrode 183 provided on the ground electrode 181 is bent in a substantial C shape, and the electromagnetic coupling module 1 is mounted such that the coil 191 is disposed along the loop electrode 183, as shown in FIG. 66. The other structure is substantially the same as in the forty ninth preferred embodiment.

The fiftieth preferred embodiment produces substantially the same effects as the forty ninth preferred embodiment. In particular, the degree of coupling between the coil 191 and the loop electrode 183 is improved and the energy can be efficiently transmitted. In addition, the electromagnetic coupling module 1 does not significantly protrude from the edge of the printed wiring board 180.

Fifty First Preferred Embodiment

Figure 67:
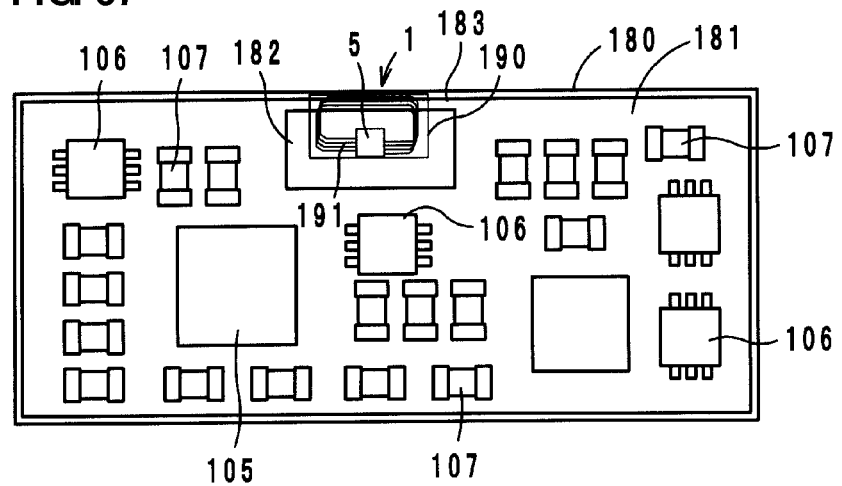
FIG. 67 is a plan view of a radio IC device according to another preferred embodiment of the present invention.

In the radio IC device according to a fifty first preferred embodiment, the electromagnetic coupling module 1 is disposed in a reverse orientation to that in the forty ninth preferred embodiment (see FIG. 62) on the printed wiring board 180, as shown in FIG. 67. The other structure is substantially the same as in the forty ninth preferred embodiment, and substantially the same effects are produced as in the forty ninth preferred embodiment. In particular, it is an advantage that the electromagnetic coupling module 1 does not significantly protrude from the edge of the printed wiring board 180.

Fifty Second Preferred Embodiment

Figure 68:
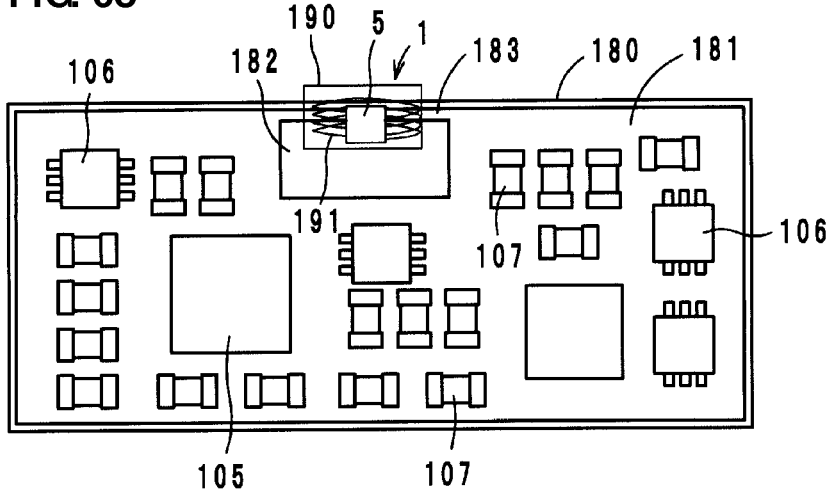
FIG. 68 is a plan view of a radio IC device according to another preferred embodiment of the present invention.

In the radio IC device according to a fifty second preferred embodiment, the feed circuit board 190 includes a coil 191 arranged such that the coil axis extends perpendicular or substantially perpendicular to the loop electrode 183, as shown in FIG. 68. The fifty second preferred embodiment produces substantially the same effects as the forty ninth preferred embodiment. In particular, the coil 191 is arranged such that the coil axis extends in the direction in which the sheets of the feed circuit board 190 are stacked, and this facilitates the formation of the coil 191.

Fifty Third Preferred Embodiment

Figure 69:
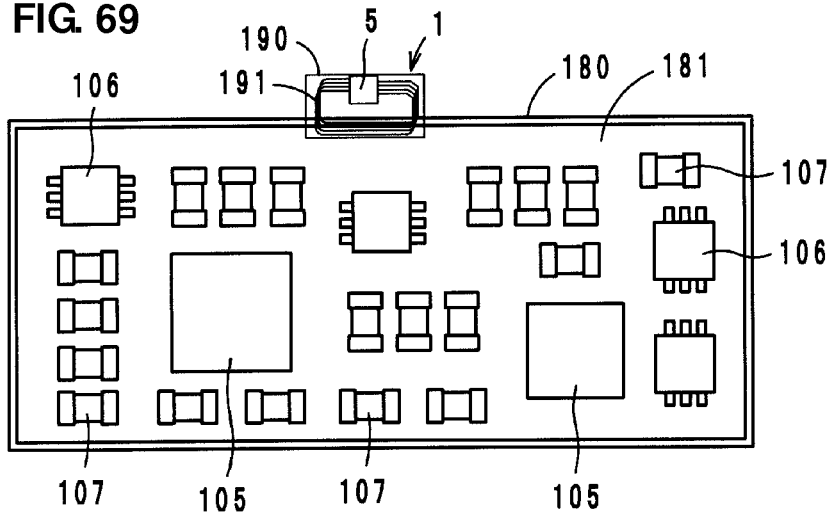
FIG. 69 is a plan view of a radio IC device according to another preferred embodiment of the present invention.

In the radio IC device according to a fifty third preferred embodiment, the electromagnetic coupling module 1 is mounted at an edge of the ground electrode 181 without providing a loop electrode 183 on the ground electrode 181, as shown in FIG. 69. The other structure is substantially the same as in the forty ninth preferred embodiment, and substantially the same effects are produced as in the forty ninth preferred embodiment. The electromagnetic coupling module 1 is operated by being coupled with a magnetic field generated by the current flowing in the edge of the ground electrode 181.

Fifty Fourth Preferred Embodiment

Figure 70:
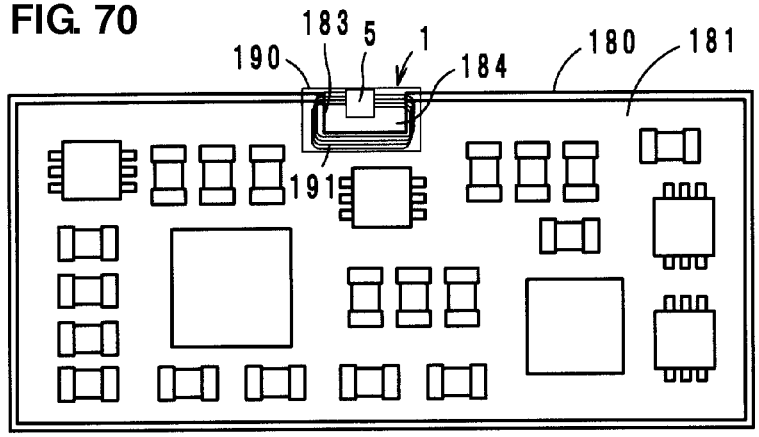
FIG. 70 is a plan view of a radio IC device according to another preferred embodiment of the present invention.

In the radio IC device according to a fifty fourth preferred embodiment, a notch 184 is provided in the printed wiring board 180, and the ground electrode 181 includes a loop electrode 183 at the edge around the notch 184, as shown in FIG. 70. The other structure is substantially the same as in the forty ninth preferred embodiment, and substantially the same effects are produced as in the forty ninth preferred embodiment.

Fifty Fifth Preferred Embodiment

Figure 71:
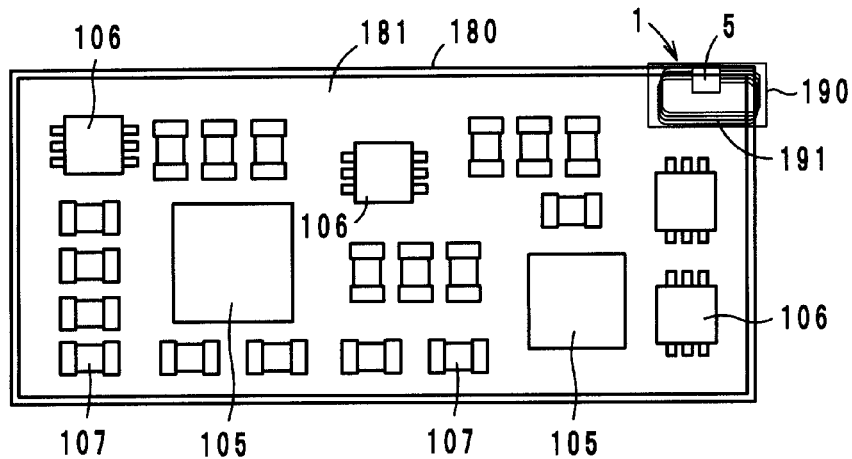
FIG. 71 is a plan view of a radio IC device according to a 55th preferred embodiment of the present invention.

In the radio IC device according to a fifty fifth preferred embodiment, the electromagnetic coupling module 1 is arranged in a corner of the ground electrode 181 as shown in FIG. 71, unlike the fifty third preferred embodiment in which the electromagnetic coupling module 1 is disposed substantially at the center of an edge of the ground electrode 181. The other structure is substantially the same as in the forty ninth and the fifty third preferred embodiment, and substantially the same effects are produced as in the forty ninth and fifty third preferred embodiment.

If the ground electrode 181 does not include the loop electrode 183, the electromagnetic coupling module 1 can be disposed anywhere on the edge of the ground electrode 181. Alternatively, a notch may be provided in the corner of the printed wiring board 180 on which the electromagnetic coupling module 1 is disposed, as disclosed in the fifty fourth preferred embodiment, and the ground electrode 181 has a loop electrode at the edge around the notch.

Fifty Sixth Preferred Embodiment

Figure 72:
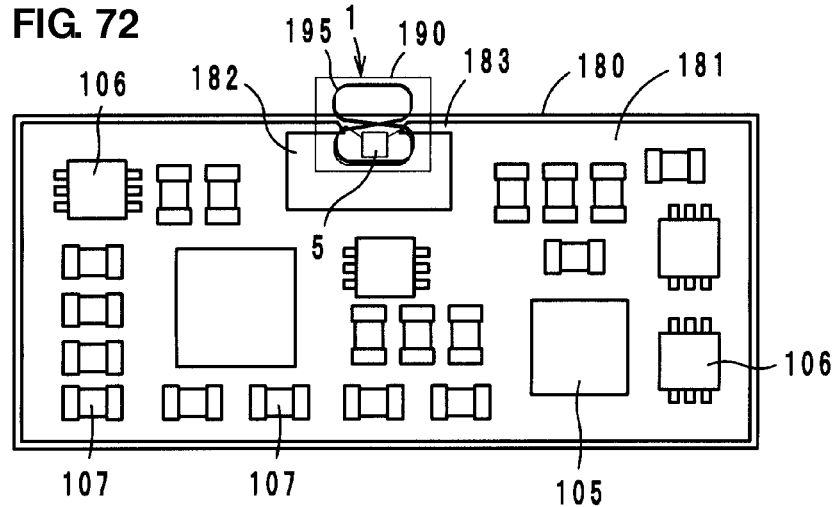
FIG. 72 is a plan view of a radio IC device according to another preferred embodiment of the present invention.
Figure 73:
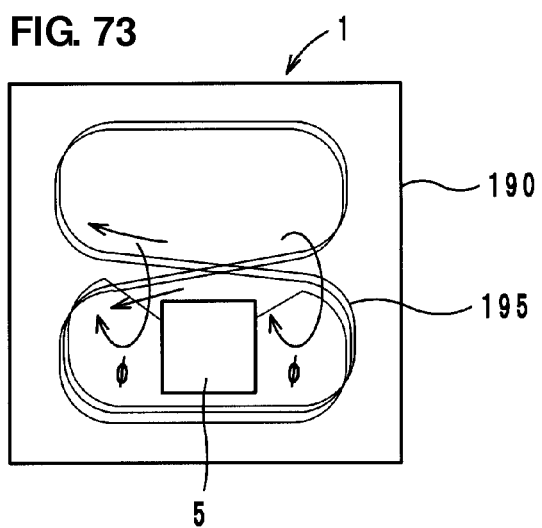
FIG. 73 is a plan view of an electromagnetic coupling module of the radio IC device according to the preferred embodiment shown in FIG. 73

In the radio IC device according to a fifty sixth preferred embodiment, a coil 195 in a feed circuit board 190 has a substantial figure 8 shape, as shown in FIG. 72, and the other structure is substantially the same as in the forty ninth preferred embodiment (see FIG. 62). The electromagnetic coupling module 1 is arranged on the printed wiring board 180 such that the magnetic flux $\phi$ generated from the loop electrode 183 can pass through the loops of the coil 195 functioning as inductance elements, as shown in FIG. 73. In the fifty sixth preferred embodiment, consequently, the ground electrode 181 functioning as a radiation plate and the electromagnetic coupling module 1 can be highly coupled.

Modification of Electromagnetic Coupling Module

Figure 74:
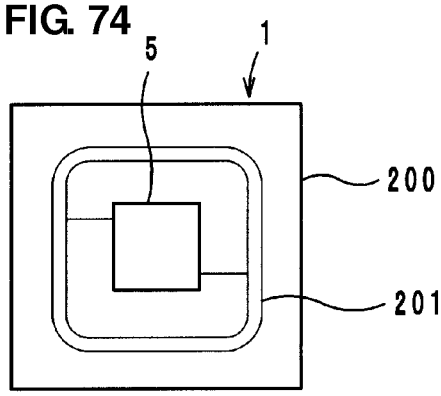
FIG. 74 is a plan view of an electromagnetic coupling module according to a modification of a preferred embodiment, used in a radio IC device according to the present invention.

The electromagnetic coupling module 1 may preferably include a square feed circuit board 200, as shown in FIG. 74. The coil 201 functioning as an inductance element also has a square shape. This electromagnetic coupling module 1 can be applied to any preferred embodiment of the present invention.

Fifty Seventh Preferred Embodiment

Figure 75:
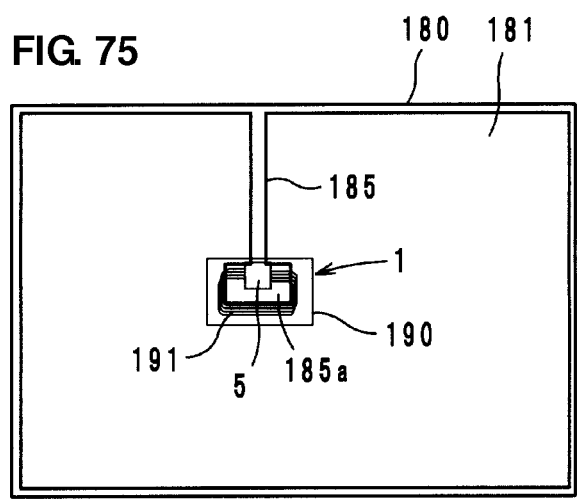
FIG. 75 is a plan view of a radio IC device according to another preferred embodiment of the present invention.

In the radio IC device according to a fifty seventh preferred embodiment, a slit 185 is provided in the ground electrode 181 disposed on the printed wiring board 180, extending from the edge to the approximate center. The slit 185 has an opening 185a at the end thereof, and the electromagnetic coupling module 1 is disposed over the opening 185a, as shown in FIG. 75. The coil 191 provided on the feed circuit board 190 and the opening 185a have substantially the same shape in plan view.

In the fifty seventh preferred embodiment, the surrounding of the opening 185a functions as a loop electrode to be magnetically coupled to the coil 191. The presence of the slit 185 improves the concentration of the current produced by the electromagnetic waves received by the ground electrode 181 around the opening 185a to generate a strong magnetic field, thus improving the degree of coupling.

The slit 185 does not necessarily communicate with the edge of the ground electrode 181. If the slit 185 is to be arranged according to the design of the printed wiring board 180, another slit is not necessarily provided for the electromagnetic coupling module 1.

In the radio IC device according to preferred embodiments of the present invention, the feed circuit board may preferably have a resonance circuit through which the radio IC is operated by the signal received by the radiation plate, and through which the answer signal from the radio IC is radiated from the radiation plate to the outside. The feed circuit board may include a matching circuit.

The inductance element may preferably be defined by a spiral electrode, for example, and the spiral electrode may be coupled with a magnetic field generated at the wiring electrode on the wiring board. The wiring electrode and the ground electrode on the wiring board may be isolated from each other, and the feed circuit board may be disposed across a region between the wiring electrode and the ground electrode. If the case is a metal, the case may function as a radiation plate by itself. If the case is non-conductive, an electroconductive electrode film may be formed on the case and the electrode film is used as the radiation plate.

The printed wiring board may preferably include an electromagnetic coupling module and other electronic components, and a case also defining the radiation plate is disposed so as to cover the high frequency device and other electronic components. The printed wiring board may include a second wiring electrode for coupling the feed circuit and the radiation plate. In particular, if the second wiring electrode is in a loop, the impedances can be matched between the radio IC and the radiation plate without providing an additional matching portion, and the signal transmission efficiency can be improved between the radio IC and the radiation plate. The loop electrode may be formed in an auxiliary substrate disposed on the feed circuit board. A plurality of printed wiring boards may be used, and a high frequency device is disposed on at least one of the printed wiring boards. A case may be arranged so as to cover the high frequency device and at least one of other electronic components.

The printed wiring board may include a second wiring electrode arranged to couple the feed circuit and the radiation plate, and a case may be arranged so as to cover all the electronic components and high frequency device mounted on the printed wiring board. The second wiring electrode may function as a portion of the radiation plate. In this instance, the radiation characteristics can be improved, and the directivity can be changed depending on the arrangement of the second wiring electrode. At least a portion of the electronic components may function as a portion of a radiation plate to improve the radiation characteristics.

The printed wiring board may include a ground electrode, and a second wiring electrode may be electrically connected to the ground electrode. By using the ground electrode having a large area as a radiation plate, the radiation characteristics can further be improved.

The second wiring electrode may be provided on the surface of or within the printed wiring board. The printed wiring board may be made of a resin or a ceramic, for example.

An external electrode coupled to the feed circuit may be formed on the surface of the feed circuit board.

The feed circuit board may be made of a ceramic or liquid crystal polymer multilayer substrate, or a flexible substrate, for example. The use of a multilayer substrate enables an inductance element or a capacitance element to be arranged precisely within the feed circuit board, thus improving the flexibility in the formation of electrodes. The use of a flexible substrate facilitates the reduction of the thickness or profile of the feed circuit board.

The radio IC may be rewritable as well as storing information of the commodity on which the radio IC device is attached, and may have other functions in addition to the function for an RFID system.

The radio IC device according to the present invention is not limited to the above-described preferred embodiments, and various modifications may be made without departing from the scope of the present invention.

For example, various types of resonance circuit or matching circuit may be used. The materials used for the external electrode and the feed circuit board in the above-described preferred embodiments are described as examples, and any material can be used as long as it has desired properties. The radio IC chip can be mounted on the feed circuit board by any method other than using a metal bump. The radio IC chip and the feed circuit may be connected by electromagnetic coupling instead of electrical direct connection. The feed circuit board may include a radio IC.

The electromagnetic coupling module may be used in a variety of apparatuses including household electrical appliances, such as TV set and refrigerator, without being limited to radio communication apparatuses, such as cellular phone.

As described above, the present invention is useful in radio IC devices used in RFID systems, and is particularly advantageous in miniaturization without reducing the radiation characteristics.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A radio IC device comprising:
   a high frequency device defined by a radio IC arranged to process transmitted and received signals and a feed circuit including an inductance element electrically connected to or electromagnetically coupled to the radio IC; and
   a radiation plate arranged so as to be coupled to the high frequency device, the radiation plate being defined by a planar ground electrode disposed on or in a printed wiring board; wherein
   the feed circuit includes at least one of a resonance circuit and a matching circuit including the inductance element through which the radio IC is operated by a signal received by the radiation plate, and through which an answer signal from the radio IC is radiated from the radiation plate to the outside;

the inductance element of the feed circuit is electromagnetically coupled to at least one of an edge of the radiation plate or a corner of the radiation plate, so as to intersect with a magnetic field generated by current flowing through the edge or the corner of the radiation plate; and a wiring electrode is provided on the printed wiring board, the wiring electrode and the ground electrode are isolated from each other, and the feed circuit is arranged across a region between the wiring electrode and the ground electrode.

2. The radio IC device according to claim 1, wherein the feed circuit includes the matching circuit.

3. The radio IC device according to claim 1, wherein the high frequency device is arranged together with at least one other electronic component on the printed wiring board, and a case is provided to cover the high frequency device and the at least one other electronic component.

4. The radio IC device according to claim 1, wherein the feed circuit is provided on a feed circuit board and an external electrode arranged to be coupled to the feed circuit is provided on a surface of the feed circuit board.

5. The radio IC device according to claim 1, wherein the high frequency device includes a multilayer substrate.

6. The radio IC device according to claim 1, wherein the high frequency device includes a flexible substrate.

7. A radio IC device comprising:
a high frequency device defined by a radio IC arranged to process transmitted and received signals and a feed circuit including an inductance element electrically connected to or electromagnetically coupled to the radio IC; and
a radiation plate arranged so as to be coupled to the high frequency device, the radiation plate being defined by a planar ground electrode disposed on or in a printed wiring board; wherein
the feed circuit includes at least one of a resonance circuit and a matching circuit including the inductance element through which the radio IC is operated by a signal received by the radiation plate, and through which an answer signal from the radio IC is radiated from the radiation plate to the outside;
the inductance element of the feed circuit is electromagnetically coupled to at least one of an edge of the radiation plate or a corner of the radiation plate, so as to intersect with a magnetic field generated by current flowing through the edge or the corner of the radiation plate;

the high frequency device is arranged together with at least one other electronic component on the printed wiring board, and a case is provided to cover the high frequency device and the at least one other electronic component;

the printed wiring board includes a second wiring electrode coupling the feed circuit and the radiation plate; and the second wiring electrode is electrically connected to a metal component disposed in an apparatus.

8. The radio IC device according to claim 7, wherein a wiring electrode is provided on the printed wiring board, the wiring electrode and the ground electrode are isolated from each other, and the feed circuit is arranged across a region between the wiring electrode and the ground electrode.

9. The radio IC device according to claim 7, wherein the second wiring electrode is a loop electrode.

10. The radio IC device according to claim 7, wherein the printed wiring board includes a plurality of printed wiring boards, the high frequency device is disposed on at least one of the plurality of printed wiring boards, and the case covers the high frequency device and at least one of the at least one other electronic component.

11. The radio IC device according to claim 7, wherein the second wiring electrode defines a portion of the radiation plate.

12. The radio IC device according to claim 7, wherein at least a portion of the at least one other electronic component defines a portion of the radiation plate.

13. The radio IC device according to claim 7, wherein the second wiring electrode is provided on a surface of or within the printed wiring board.

14. The radio IC device according claim 7, wherein the printed wiring board is made of a resin or a ceramic.

15. The radio IC device according to claim 7, wherein the feed circuit includes the matching circuit.

16. The radio IC device according to claim 7, wherein the feed circuit is provided on a feed circuit board and an external electrode arranged to be coupled to the feed circuit is provided on a surface of the feed circuit board.

17. The radio IC device according to claim 7, wherein the high frequency device includes a multilayer substrate.

18. The radio IC device according to claim 7, wherein the high frequency device includes a flexible substrate.

* * * * *